United States Patent [19]
Takeuchi et al.

[11] Patent Number: 5,627,493
[45] Date of Patent: May 6, 1997

[54] SEMICONDUCTOR DEVICE HAVING SUPPLY VOLTAGE DEBOOSTING CIRCUIT

[75] Inventors: Yoshiaki Takeuchi; Hiroaki Tanaka; Masaru Koyanagi, all of Yokohama, Japan

[73] Assignee: Kabushiki Kaisha Toshiba, Kawasaki, Japan

[21] Appl. No.: 519,249

[22] Filed: Aug. 25, 1995

Related U.S. Application Data

[63] Continuation of Ser. No. 109,346, Aug. 20, 1993, abandoned.

[30] Foreign Application Priority Data

Aug. 21, 1992 [JP] Japan ..................... 4-223022

[51] Int. Cl.$^6$ ..................................... G05F 3/02
[52] U.S. Cl. ................. 327/546; 327/407; 327/530; 327/535; 327/525; 327/545; 365/226
[58] Field of Search .................. 307/296.1, 296.2, 307/530, 355, 362, 296.3, 358; 365/226; 327/541, 545, 546, 407; 326/63

[56] References Cited

U.S. PATENT DOCUMENTS

| | | | |
|---|---|---|---|
| 4,223,277 | 9/1980 | Taylor et al. | 327/525 |
| 4,593,203 | 6/1986 | Iwahashi et al. | 327/525 |
| 4,833,341 | 5/1989 | Watanabe et al. | 307/296.1 |
| 4,837,520 | 6/1989 | Golke et al. | 327/525 |
| 5,045,772 | 9/1991 | Nishiwaki et al. | 307/296.1 |
| 5,175,451 | 12/1992 | Ihara | 307/530 |
| 5,184,031 | 2/1993 | Hayakawa et al. | 307/296.1 |
| 5,329,178 | 7/1994 | Burton | 307/296.3 |
| 5,349,559 | 9/1994 | Park et al. | 365/226 |
| 5,396,113 | 3/1995 | Park et al. | 327/530 |

OTHER PUBLICATIONS

S. Koshimaru et al., "Low Power and High-Speed 4M Bit DRAM Family with Self-Refresh Mode," *NEC Technical Report*, vol. 45, No. 8, pp. 57-61, Aug. 1992.

Primary Examiner—Timothy P. Callahan
Assistant Examiner—Dinh T. Le
Attorney, Agent, or Firm—Foley & Lardner

[57] ABSTRACT

The semiconductor device comprises: an internal supply voltage deboosting circuit for inputting an external supply voltage, deboosting the inputted external supply voltage, and outputting a deboosted voltage as an internal supply voltage; a first control circuit for deactivating the internal supply voltage deboosting circuit when the external supply voltage is lower than a predetermined value; and a second control circuit for outputting the external supply voltage as the internal supply voltage when the external supply voltage is lower than the predetermined value. When the external supply voltage is lower than a predetermined value, since the internal supply voltage deboosting circuit is deactivated by the first control circuit, the current consumption can be reduced. Further, since the external supply voltage is outputted as the internal supply voltage by the second control circuit, the deboosting operation is not required. The device is usable for different external supply voltages in spite of the same circuit configuration, while preventing the operational margin from being deteriorated.

23 Claims, 13 Drawing Sheets

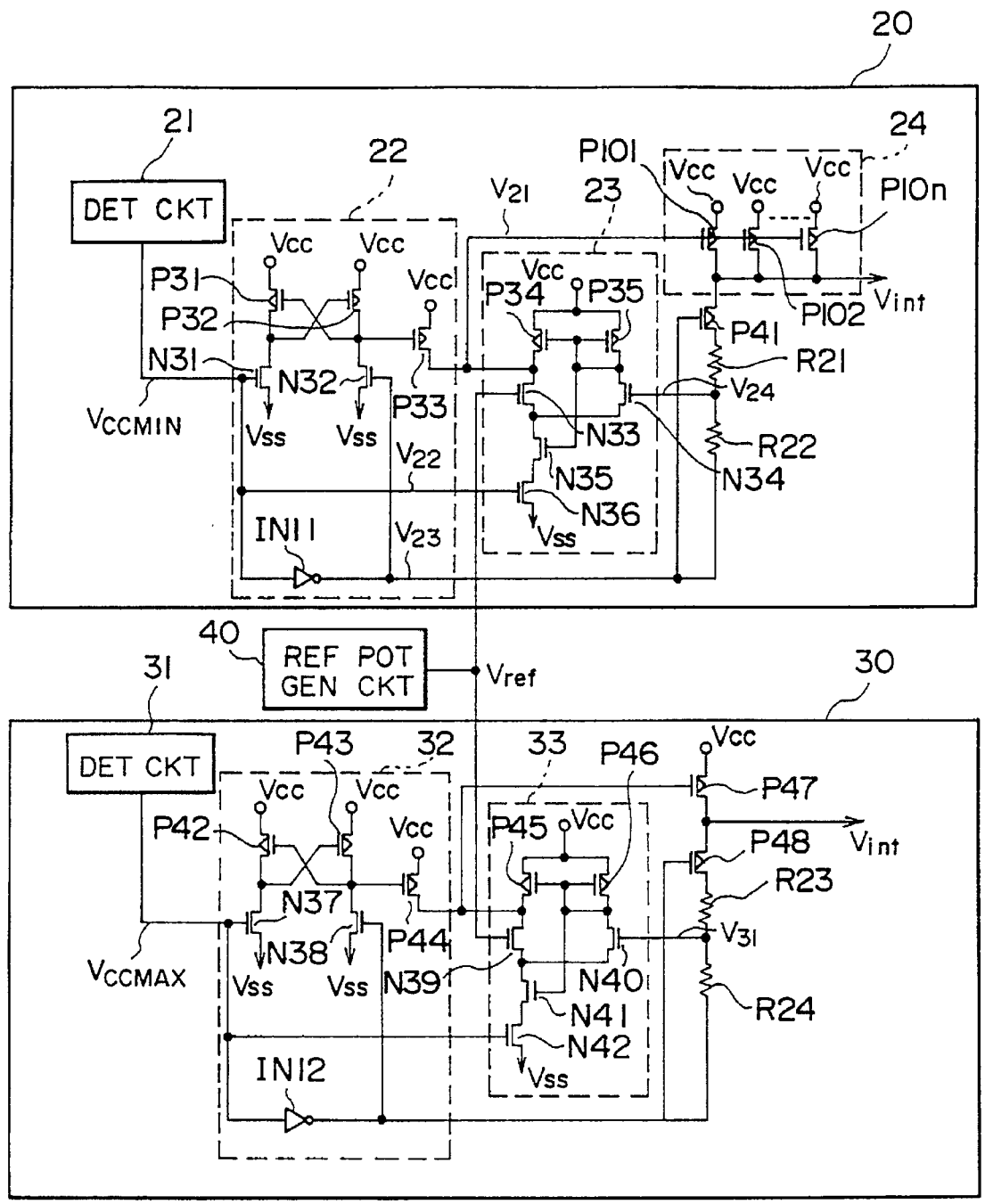
F I G. 7

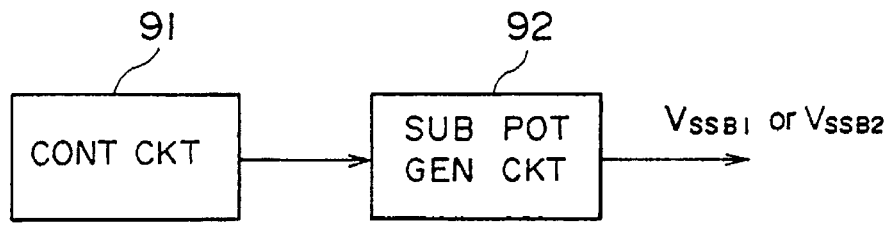
F I G. 15
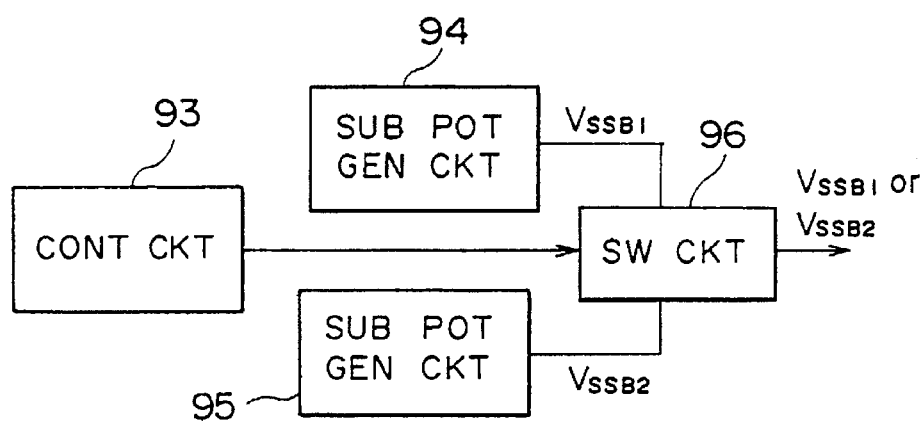
F I G. 16
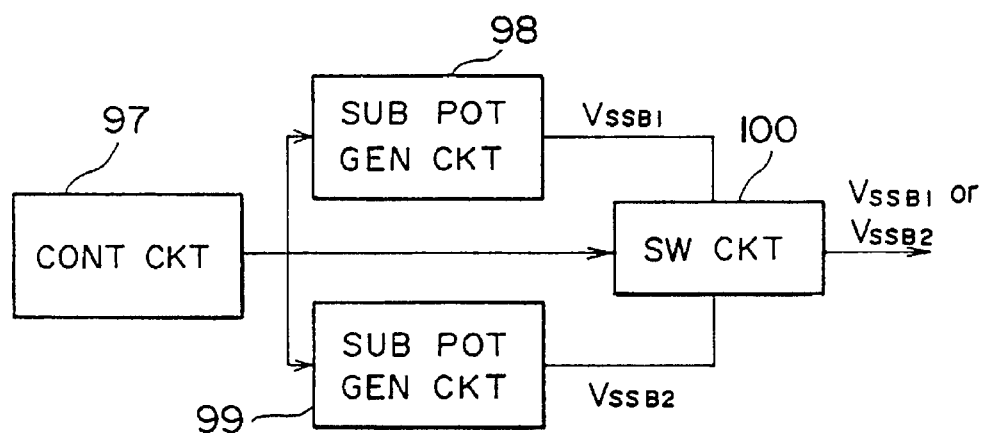
F I G. 17

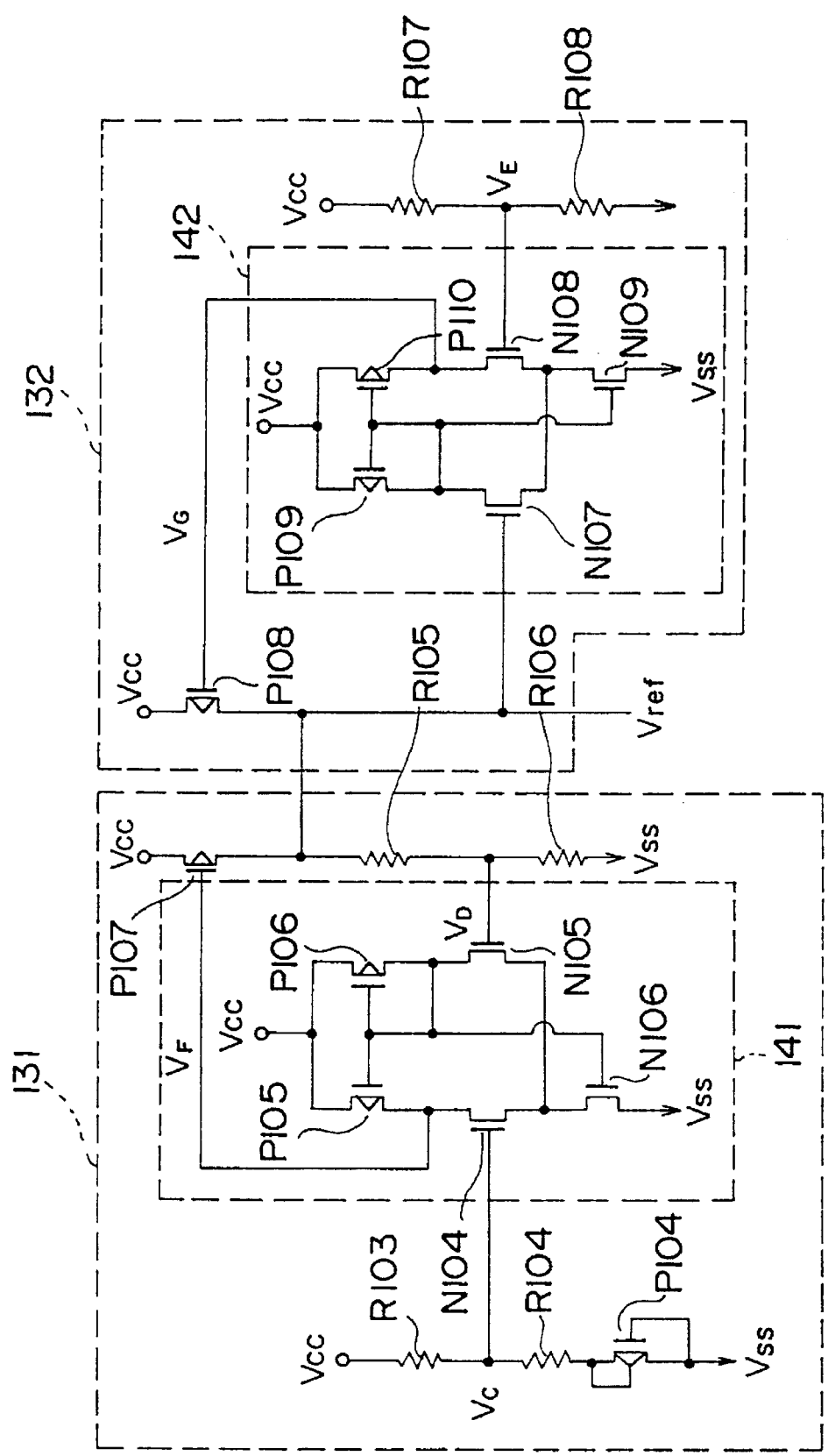
F I G. 22

1

SEMICONDUCTOR DEVICE HAVING SUPPLY VOLTAGE DEBOOSTING CIRCUIT

This application is a continuation of application Ser. No. 08/109,346, filed Aug. 20, 1993 and now abandoned.

BACKGROUND OF THE INVENTION

1. Field of the Invention

The present invention relates to a semiconductor device, and more specifically to a semiconductor device provided with an internal supply voltage deboosting circuit.

2. Description of the Prior Art

With the advance of the microminiaturization of elements of semiconductor integrated circuits, there arises a problem in that when an ordinary (e.g., 5 V) external supply voltage Vcc is applied to the elements, the gate oxide films are destroyed or hot carriers are generated, thus causing deterioration of the circuit reliability. In order to secure the reliability of the microminiaturized elements such as transistors of the semiconductor memory device in particular, the memory device is required to include an internal supply voltage deboosting circuit for deboosting an external supply voltage within the chip to reduce voltage stress on the device. Further, where the external supply voltage is deboosted, it is possible to reduce the power consumption of the device and thereby to improve the battery backup time intervals of an electronic apparatus such as a portable personal computer.

FIG. 21 shows a prior art internal supply voltage deboosting circuit, by way of example. This prior art deboosting circuit is composed of a reference potential generating circuit 121, a P-channel transistor P103 for driving an internal supply voltage $V_{int}$, a current mirror type differential amplifier 122 made up of P-channel transistors P101 and P102 for controlling the switching operation of the P-channel transistor P103 and N-channel transistors N101 to N103, and resistors R101 and R102.

The referential potential generating circuit 121 generates a reference potential $V_{ref}$ on the basis of an external supply voltage Vcc. On the other hand, a voltage difference between an internal supply voltage $V_{int}$ (outputted from the P-channel transistor P103) and a ground voltage Vss is divided by the two resistors R101 and R102, and the divided voltage is outputted as a potential $V_A$.

The reference voltage $V_{ref}$ and the potential $V_A$ are inputted to the gates of the two N-channel transistors N101 and N102 of the differential amplifier 122, respectively. When the external supply voltage Vcc is relatively low, since the potential $V_A$ is lower than the reference voltage $V_{ref}$, an output voltage $V_B$ of the differential amplifier 122 is at a low level, so that the P-channel transistor P103 is turned on. Here, when the dimensions of the P-channel transistor P103 are determined so that the resistance of the transistor P103 is to be sufficiently smaller than those of the resistors R101 and R102, it is possible to obtain an internal supply voltage $V_{int}$ roughly equal to the external supply voltage Vcc.

In contrast with this, when the external supply voltage Vcc is relatively high, since the potential $V_A$ is higher than the reference voltage $V_{ref}$, the output voltage $V_B$ of the differential amplifier 122 is at a high level, so that the P-channel transistor P103 is turned off. Therefore, the level of the internal supply voltage $V_{int}$ drops because the voltage $V_{int}$ int is discharged through the resistors R01 and R102. Here, when the potential $V_A$ becomes lower than the reference voltage $V_{ref}$, since the P-channel transistor P103 is turned on again, the internal supply voltage $V_{int}$ is kept at a constant level. As a result, it is possible to keep the internal supply voltage $V_{int}$ at a constant level at a point where the potential $V_A$ becomes equal to the reference voltage $V_{ref}$.

As described above, when the external supply voltage Vcc is relatively low, the reference voltage $V_{ref}$ is higher than the potential $V_A$, so that it is possible to obtain the internal supply voltage $V_{int}$ roughly equal to the external supply voltage Vcc. On the other hand, when the external supply voltage Vcc is relatively high, the internal supply voltage $V_{int}$ is kept at a constant level at a point where the reference voltage $V_{ref}$ becomes equal to the potential $V_A$.

FIG. 22 shows a practical circuit construction of the reference potential generating circuit 21, and FIG. 23 shows the characteristics between the reference potential $V_{ref}$, the internal supply voltage $V_{int}$ and the external supply voltage Vcc, which are obtained by the circuit shown in FIG. 22.

The reference potential generating circuit 21 is composed of two circuits 131 and 132. The circuit 131 serves to determine the characteristics of the reference voltage $V_{ref}$ when the external supply voltage Vcc ranges between 0 V and $V_{cur}$. Here, the voltage $V_{cur}$ corresponds to the external supply voltage Vcc obtained when the reference voltage $V_{ref}$ becomes equal to a voltage $V_E$ of the circuit 132 (described later). Further, the circuit 132 serves to determine the characteristics of the reference voltage $V_{ref}$ obtained when the supply voltage Vcc is higher than the voltage $V_{cur}$.

In the circuit 131, two resistors R103 and R104 and a P-channel transistor P104 are connected in series between the external supply voltage Vcc and the ground voltage Vss. A voltage $V_C$ can be generated from a node between the two resistors R103 and R104. Here, since the resistance value of the resistor R103 is determined to be sufficiently higher than that of the resistor R104, the voltage $V_C$ can be set to a constant level almost without being dependent upon the external supply voltage Vcc.

This generated voltage $V_C$ is inputted to a differential amplifier 141 composed of two P-channel transistors P105 and P106 and three N-channel transistors N104 to N106. Further, a P-channel transistor P107 and two resistors R105 and R106 are connected in series between the external supply voltage Vcc and the ground voltage Vss. A voltage $V_D$ can be generated from a node between the two resistors R105 and R106. Further, these two voltages $V_D$ and $V_C$ are both inputted to the differential amplifier 141. In the circuit 131, in the same way as with the case of the circuit as shown in FIG. 21, when the external supply voltage Vcc is relatively high, the reference voltage $V_{ref}$ outputted from a node between the P-channel transistor P107 and the resistor R105 is kept at a constant level. Here, in the case of the circuit shown in FIG. 21, the resistance of the P-channel transistor P103 is determined to be sufficiently smaller than those of the resistors R101 and R102. In the case of the circuit 131 shown in FIG. 22, however, the resistance of the P-channel transistor P107 is determined to be sufficiently larger than those of the resistors R105 and R106. This is because the voltage $V_D$ must be determined by the resistance division of the P-channel transistor P107 and the resistor R105, and the resistor R106.

The circuit 132 includes two resistors R107 and R108, a differential amplifier 142, and a driving P-channel transistor P108. A potential $V_E$ obtained by dividing the external supply voltage Vcc by the two resistors R107 and R108, and the reference potential $V_{ref}$ are both inputted to the reference amplifier 142 for comparison of both.

When the external supply voltage Vcc ranges between 0 V and $V_{cur}$, the reference voltage $V_{ref}$ becomes higher than the potential $V_E$. In this case, an output voltage $V_G$ of the differential amplifier 142 becomes a high level, so that the P-channel transistor P108 is turned off. Accordingly, the reference potential $V_{ref}$ can be determined by only the circuit 131.

When the external supply voltage Vcc becomes higher than the potential $V_{cur}$, the reference voltage $V_{ref}$ becomes lower than the potential $V_E$. Therefore, the output voltage $V_G$ of the differential amplifier 142 becomes a low level, so that the P-channel transistor P108 is turned on. Once the P-channel transistor P108 is turned on, the voltage $V_D$ of the circuit 131 rises. Accordingly, an output voltage $V_F$ of the differential amplifier 141 of the circuit 131 becomes the high level, so that the P-channel transistor P107 is turned off. As a result, the reference potential $V_{ref}$ can be determined by only the circuit 132. When the external supply voltage Vcc further rises, the reference voltage $V_{ref}$ also rises.

Further, in FIG. 23, the internal supply voltage $V_{int}$ rises in a range in which the external supply voltage Vcc is higher than the voltage $V_{cur}$. This is because in the case of products whose external supply voltage Vcc is 5 V, although the voltage range to be used is between 4.5 V and 5 V, a burn-in test must be performed in a voltage range higher than the above-mentioned range.

As described above, conventionally, the internal supply voltage has been generated by deboosting the external supply voltage with the use of the circuit as shown in FIGS. 21 and 22. Recently, however, since lower power consumption is required more and more in portable electronic apparatus, a lower supply voltage is required more and more for the DRAM in the same manner in the CPU.

Therefore, it has been required that the same circuit be used for both products activated by two external supply voltages Vcc=5 V and 3.3 V. In this case, when the external supply voltage Vcc is 5 V, an internal supply voltage deboosting circuit for deboosting the external supply voltage from 5 V to 4 V is required. When the external supply voltage Vcc is 3.3 V, however, no internal supply voltage deboosting circuit is required. In the conventional semiconductor device, however, since the internal supply voltage deboosting circuit is being activated even when the external supply voltage Vcc is 3.3 V, there exists a problem in that the current consumption cannot be reduced.

Further, in FIG. 21, since the internal supply voltage $V_{int}$ is generated by the P-channel transistor P103, the dimensions of this transistor have been important. When the external supply voltage Vcc is 3.3 V, it has been necessary to determine the dimensions of the P-channel transistors P103 to be as large as possible. This is because when the dimensions of the transistor are small, the voltage drops, with the result that only an internal supply voltage $V_{int}$ lower than 3.3 V is obtained.

In contrast with this, when the external supply voltage Vcc is high, even if the dimensions of the transistor are small, the influence upon the operational margin is small. In this case, it is rather preferable to determine the dimensions of the P-channel transistors P103 to be small to reduce the switching noise thereof.

As described above, in the conventional semiconductor device, it has been difficult to cope with both the cases where the external supply voltage Vcc is high and low, because the optimum dimensions of the driving transistor are different from each other.

Further, as another example, there exists the semiconductor device having the internal supply voltage deboosting circuit provided with an output buffer circuit. In this case, since output transistor used for the output buffer circuit becomes low in conductance when the external supply voltage Vcc is low, the current driving faculty is inevitably deteriorated. The deterioration of the driving faculty of the output transistor causes a drop of the access speed. To prevent this phenomenon, the dimensions of the output transistor must be increased. When the external supply voltage Vcc is high, however, another problem is caused in that the switching noise of the transistor increases, so that the margin to the high and low levels of the input signal decreases.

Further, the semiconductor device having the internal supply voltage deboosting circuit is sometimes provided with a sense amplifier circuit. In this case, the sense amplifier is usually composed of a P-channel sense amplifier composed of P-channel transistors and an N-channel sense amplifier composed of N-channel transistors. When data stored in the memory cells are read, the P-channel transistors are activated by charging the common source node by the external supply voltage Vcc until the potential thereat reaches the internal supply voltage $V_{int}$.

When the common source node is charged, the reference voltage $V_{RSAP}$ must be determined to be low to reduce the switching noise when the external supply voltage Vcc is high. However, when the external supply voltage Vcc is low, if the reference voltage $V_{RSAP}$ the same as when the external supply voltage Vcc is high is used, there exists a problem in that it takes a long charging time, so that it is impossible to restore the bit lines sufficiently within a predetermined time period.

SUMMARY OF THE INVENTION

With these problems in mind, therefore, it is the object of the present invention to provide a semiconductor device, which is low in power consumption and usable for different external supply voltages in spite of the same circuit configuration, while preventing the operational margin from being deteriorated.

To achieve the above-mentioned object, the present invention provides a semiconductor device, comprising: an internal supply voltage deboosting circuit for inputting an external supply voltage, deboosting the inputted external supply voltage, and outputting a deboosted voltage as an internal supply voltage; a first control circuit for deactivating said internal supply voltage deboosting circuit when the external supply voltage is lower than a predetermined value; and a second control circuit for outputting the external supply voltage as the internal supply voltage when the external supply voltage is lower than the predetermined value.

In the above-mentioned semiconductor device, when the external supply voltage is lower than a predetermined value, since the internal supply voltage deboosting circuit is deactivated by the first control circuit, the current consumption can be reduced. Further, since the external supply voltage is outputted as the internal supply voltage by the second control circuit, the deboosting operation is not required.

Here, the second control circuit includes an input terminal for inputting the external supply voltage and an output terminal for outputting the internal supply voltage; the input terminal and the output terminal being connected by a fuse or a bonding wire when the external supply voltage is lower than the predetermined value and disconnected when the external supply voltage is higher than the predetermined value.

In this case, since the input terminal and the output terminal are connected to each other by a fuse or a bonding wire, it is possible to output the external supply voltage as the internal supply voltage as it is.

Further, the second control circuit includes an input terminal for inputting the external supply voltage, an output terminal for outputting the internal supply voltage, and a switching element interposed between the input and output terminals so as to be turned on or off by a fuse or a bonding wire; the input terminal and the output terminal being connected to each other by turning on the switching element when the external supply voltage is lower than the predetermined value and disconnected from each other by turning off the switching element when the external supply voltage is higher than the predetermined value.

In this case, when the external supply voltage is lower than a predetermined value, since the switching element is turned on to connect the input terminal to the output terminal, the external supply voltage can be outputted as the internal supply voltage. When the external supply voltage is higher than the predetermined value, on the other hand, since the switching element is turned off, the input terminal and the output terminal are disconnected from each other.

Another aspect of the present invention provides a semiconductor device, comprising: an internal supply voltage deboosting circuit having a first terminal for inputting a first external supply voltage and a second terminal for inputting a second external supply voltage, for deboosting a potential difference between the first and second external supply voltages, and outputting the deboosted voltage as an internal supply voltage; a first control circuit for roughly equalizing a first potential at the first terminal to a second potential at the second terminal by use of a fuse or a bonding wire when a potential difference between the first and second external supply voltages is lower than a predetermined value, to deactivate said internal supply voltage deboosting circuit; and a second control circuit for outputting the equalized external supply voltage as the internal supply voltage when the potential difference between the first and second external supply voltages is lower than the predetermined value.

In this case, when the potential difference between the two is lower than a predetermined value, since the potential at the first terminal is equalized to the potential at the second terminal by a fuse or a bonding wire to deactivate the internal supply voltage deboosting circuit, the external supply voltage can be outputted as the internal supply voltage.

Further, another aspect of the present invention provides a semiconductor device, comprising: an internal supply voltage deboosting circuit having a first terminal for inputting a first external supply voltage and a second terminal for inputting a second external supply voltage, for deboosting a potential difference between the first and second external supply voltages and outputting the deboosted voltage as an internal supply voltage; a first control circuit for controlling at least one of voltage supplies of the first external supply voltage to the first terminal and of the second external supply voltage to the second terminal by use of a fuse or a bonding wire, said first control circuit deactivating said internal supply voltage deboosting circuit by inhibiting at least one of voltage supplies of the first external supply voltage to the first terminal and of the second external supply voltage to the second terminal when a potential difference between the first and second external supply voltages is lower than a predetermined value; and a second control circuit for outputting the external supply voltage as the internal supply voltage when the external supply voltage is lower than a predetermined value.

In this case, in the internal supply voltage deboosting circuit, since at least one of the voltage supplies of the first external supply voltage to the first terminal and of the second external supply voltage to the second terminal is inhibited to deactivate the internal supply voltage deboosting circuit, the external supply voltage is outputted as the internal supply voltage.

Further, another aspect of the present invention provides a semiconductor device, comprising: an internal supply voltage deboosting circuit having an internal supply voltage driving transistor, for inputting an external supply voltage, deboosting the inputted external supply voltage, and outputting a deboosted voltage as an internal supply voltage from the internal supply voltage driving transistor; and a control circuit for increasing conductance of the internal supply voltage driving transistor when the external supply voltage is lower than a predetermined value, as compared with when the external supply voltage is higher than a predetermined value.

In this case, when the external supply voltage is lower than a predetermined value, since the control circuit increases the conductance of the internal supply voltage driving transistor as compared with when the external supply voltage is higher than a predetermined value, the internal supply voltage can be prevented from being lowered.

Further, another aspect of the present invention provides a semiconductor device, comprising: a first internal supply voltage deboosting circuit having a first internal supply voltage driving transistor, for inputting an external supply voltage, deboosting the inputted external supply voltage, and outputting a deboosted voltage as an internal supply voltage from the first internal supply voltage driving transistor; a second internal supply voltage deboosting circuit having a second internal supply voltage driving transistor, for inputting the external supply voltage, deboosting the inputted external supply voltage, and outputting a deboosted voltage as an internal supply voltage from the second internal supply voltage driving transistor; and a control circuit for comparing the external supply voltage with a predetermined value, and turning on both the first and second internal supply voltage driving transistors when the external supply voltage is lower than the predetermined value but only the first internal supply voltage driving transistor when the external supply voltage is higher than the predetermined value.

In this case, when the external supply voltage is lower than a predetermined value, since the control circuit turns on both the first internal supply voltage driving transistor and the second internal supply voltage driving transistor, the overall dimensions of the internal supply voltage driving transistors are increased, so that the internal supply voltage can be prevented from being lowered. On the other hand, when the external supply voltage is higher than the predetermined value, since the control circuit turns on only the first internal supply voltage driving transistor, the dimensions of the internal supply voltage driving transistors is decreased, so that the noise level generated in switching operation can be reduced.

Further, another aspect of the present invention provides a semiconductor device, comprising: an internal supply voltage deboosting circuit for inputting an external supply voltage, deboosting the inputted external supply voltage, and outputting the deboosted voltage as an internal supply voltage; an output buffer circuit having an output transistor operative on the basis of the external supply voltage or the internal supply voltage, for outputting an inputted signal to the outside from the output transistor; and a control circuit for increasing conductance of the output transistor when the external supply voltage is lower than a predetermined value, as compared with when the external supply voltage is higher than a predetermined value.

In the case where an output buffer is provided, when the external supply voltage is lower than a predetermined value, since the conductance of the output transistor is increased as compared with when the external supply voltage is higher than a predetermined value, the output level of the output transistor can be prevented from being lowered.

Further, another aspect of the present invention provides a semiconductor device, comprising: a sense amplifier circuit for inputting a signal, detecting the inputted signal, and outputting a detected result to the outside; a control circuit for inputting a reference potential, and activating said sense amplifier circuit on the basis of the reference potential; a reference potential generating circuit for inputting an external supply voltage, deboosting the inputted external supply voltage, and outputting the reference potential; and a reference potential control circuit for increasing a level of the reference potential when the external supply voltage is lower than a predetermined value, as compared with when the external supply voltage is higher than the predetermined value.

In the case where a sense amplifier circuit is provided, when the external supply voltage is lower than a predetermined value, since the reference potential given to the control circuit for activating the sense amplifier circuit is increased as compared with when the external supply voltage is higher than the predetermined value, the speed of activating the sense amplifier circuit can be increased.

Further, another aspect of the present invention provides a semiconductor device, comprising: a control circuit for inputting an external supply voltage, outputting a first control signal when the external supply voltage is higher than a predetermined value, and outputting a second control signal when the external supply voltage is lower than the predetermined value; and a potential generating circuit for outputting a first boosted potential when said control circuit outputs the first control signal, and a second boosted potential when said control circuit outputs the second control signal.

In the case where the control circuit and the potential generating circuit are both provided, the desired the first boosted potential or the second boosted potential is outputted according to whether or not the external supply voltage is higher than a predetermined value.

Further, another aspect of the present invention provides a semiconductor device, comprising: a control circuit for inputting an external supply voltage, outputting a first control signal when the external supply voltage is higher than a predetermined value, and outputting a second control signal when the external supply voltage is lower than the predetermined value; a first boosted potential generating circuit for generating a first boosted potential; a second boosted potential generating circuit for generating a second boosted potential; and a switching circuit responsive to the first and second boosted potentials, for outputting a first boosted potential when said control circuit outputs the first control signal, and a second boosted potential when said control circuit outputs the second control signal.

Further, another aspect of the present invention provides a semiconductor device, comprising: a control circuit for inputting an external supply voltage, outputting a first control signal when the external supply voltage is higher than a predetermined value, and outputting a second control signal when the external supply voltage is lower than the predetermined value; a first potential generating circuit for outputting a first boosted potential when said control circuit outputs the first control signal, said first potential generating circuit being deactivated when said control circuit outputs the second control signal; a second potential generating circuit for outputting a second boosted potential when said control circuit outputs the second control signal, said second potential generating circuit being deactivated when said control circuit outputs the first control signal; and a switching circuit for outputting a first boosted potential given by said first boosted potential generating circuit when said control circuit outputs the first control signal and a second boosted potential given by said second boosted potential generating circuit when said control circuit outputs the second control signal.

Here, the control circuit compares the inputted external supply voltage with the predetermined value, and outputs the first control signal when the external supply voltage is higher than the predetermined value and the second control signal when the external supply voltage is lower than the predetermined value.

Alternatively, the control circuit includes two bonding pads, and selectively outputs either the first or second control signal according to whether or not the two bonding pads are connected to each other by a bonding wire.

Further, the control circuit includes two terminals, and selectively outputs either the first or second control signal according to whether or not the two terminals are connected to each other by a fuse.

Furthermore, the control circuit includes a non-volatile memory element, and selectively outputs either the first or second control signal according to a value stored in the non-volatile memory element.

BRIEF DESCRIPTION OF THE DRAWINGS

FIG. 7 is a circuit diagram showing a second embodiment of the semiconductor device according to the present invention;

FIG. 15 is a circuit diagram showing an eighth embodiment of the semiconductor device according to the present invention;

FIG. 16 is a circuit diagram showing a ninth embodiment of the semiconductor device according to the present invention;

FIG. 17 is a circuit diagram showing a tenth embodiment of the semiconductor device according to the present invention;

FIG. 22 is a circuit diagram showing the reference potential generating circuit of the prior art semiconductor device shown in FIG. 21.

DETAILED DESCRIPTION OF THE PREFERRED EMBODIMENTS

Embodiments of the semiconductor device according to the present invention will be described hereinbelow with reference to the attached drawings.

Figure 1:
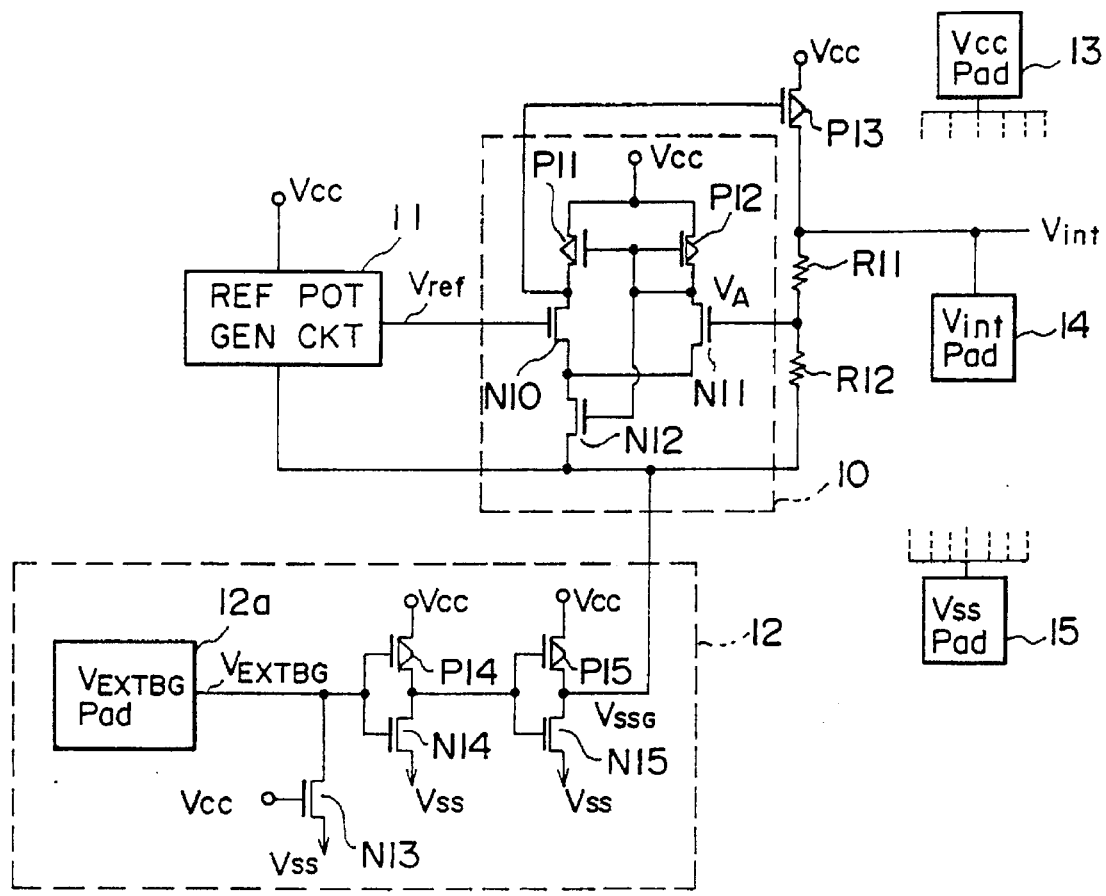
FIG. 1 is a circuit diagram showing a first embodiment of the semiconductor device according to the present invention.

FIG. 1 shows a first embodiment of the semiconductor device according to the present invention. In the same way as with the case of the prior art semiconductor device shown in FIG. 21, the device comprises a reference potential generating circuit 11 for generating a reference potential $V_{ref}$ on the basis of an external supply voltage Vcc, a P-type transistor P13 for driving an internal supply voltage $V_{int}$, two resistors R11 and R12, and a differential amplifier 10 for controlling the operation of the P-channel transistor P13. The feature of this first embodiment is that the device is further provided with a control circuit 12 for controlling the operation of the differential amplifier 10, a bonding pad 13 for supplying the external supply voltage Vcc, a bonding pad 14 for outputting the internal supply voltage $V_{int}$, and a bonding pad 15 grounded.

The control circuit 12 includes a bonding pad 12a, an N-channel transistor N13, a first inverter composed of a P-channel transistor P14 and an N-channel transistor N14, and a second inverter composed of a P-channel transistor P15 and an N-channel transistor N15. The N-channel transistor N13 is connected between the bonding pad 12 and a ground voltage (Vss) terminal, and the external supply voltage Vcc is supplied to the gate of the N-channel transistor N13. Both gates of the P-channel transistor P14 and the N-channel transistor N14 are connected in common to the bonding pad 12a. Both gates of the P-channel transistor P15 and the N-channel transistor N15 are connected in common to an output terminal of the first inverter, and the output terminal of the second inverter is connected to the source of the N-channel transistor N12 of the differential amplifier 10.

First, when the external supply voltage Vcc is higher than a predetermined value (e.g., 5 V), the device operates as follows: In this case, the control circuit 12 is under the condition as shown in FIG. 1; that is, the bonding pad 12a is not connected to the other bonding pads.

The N-channel transistor N13 is turned on in response to the external supply voltage Vcc inputted to the gate thereof, so that a node at which the bonding pad 2a is connected to the drain of the N-channel transistor N13 is kept at the ground level. Accordingly, since a low (ground) level potential is applied to the gates of the P-channel transistor P14 and the N-channel transistor N14, the low level potential is inverted by the first inverter composed of these transistors P14 and N14, so that a high level potential is applied to the gates of the P-channel transistor P15 and the N-channel transistor N15. Therefore, the high level potential is further inverted by the second inverter composed of the P-channel transistor P15 and the N-channel transistor N15, so that the output potential $V_{SSG}$ of the second inverter becomes equal to the ground level Vss.

Figure 21:
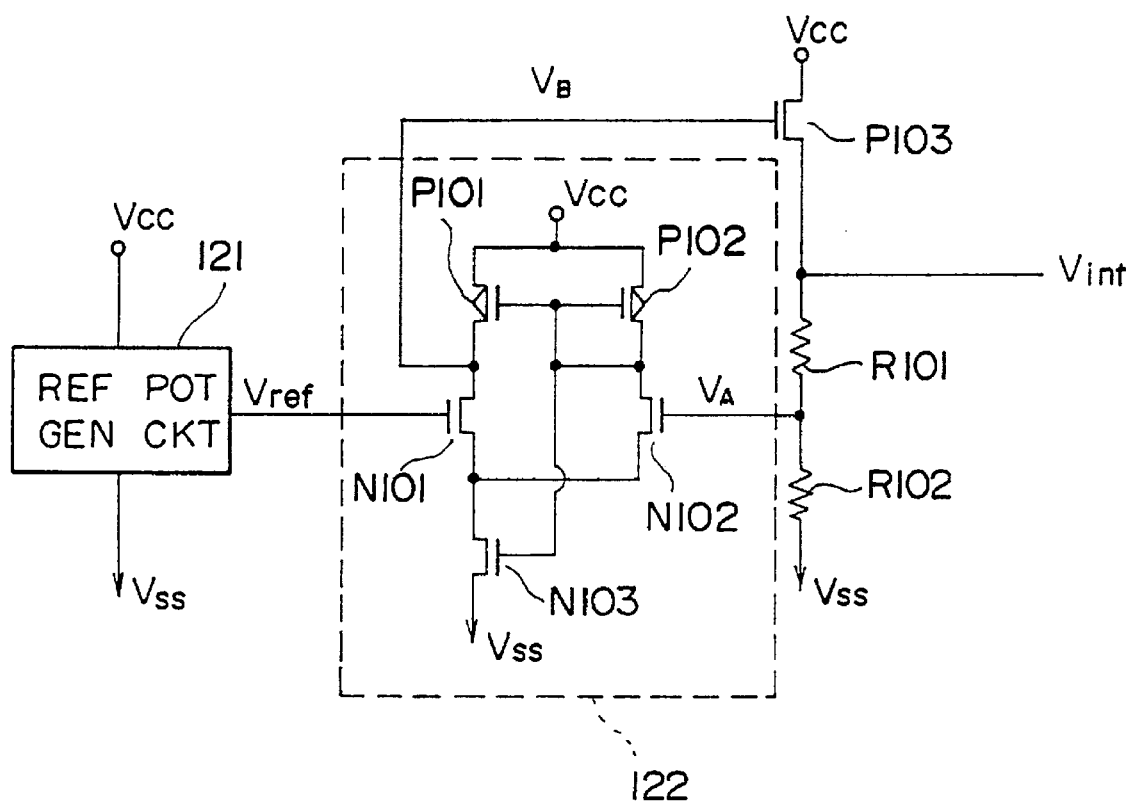
FIG. 21 is a circuit diagram showing a prior art semiconductor device.
Figure 23:
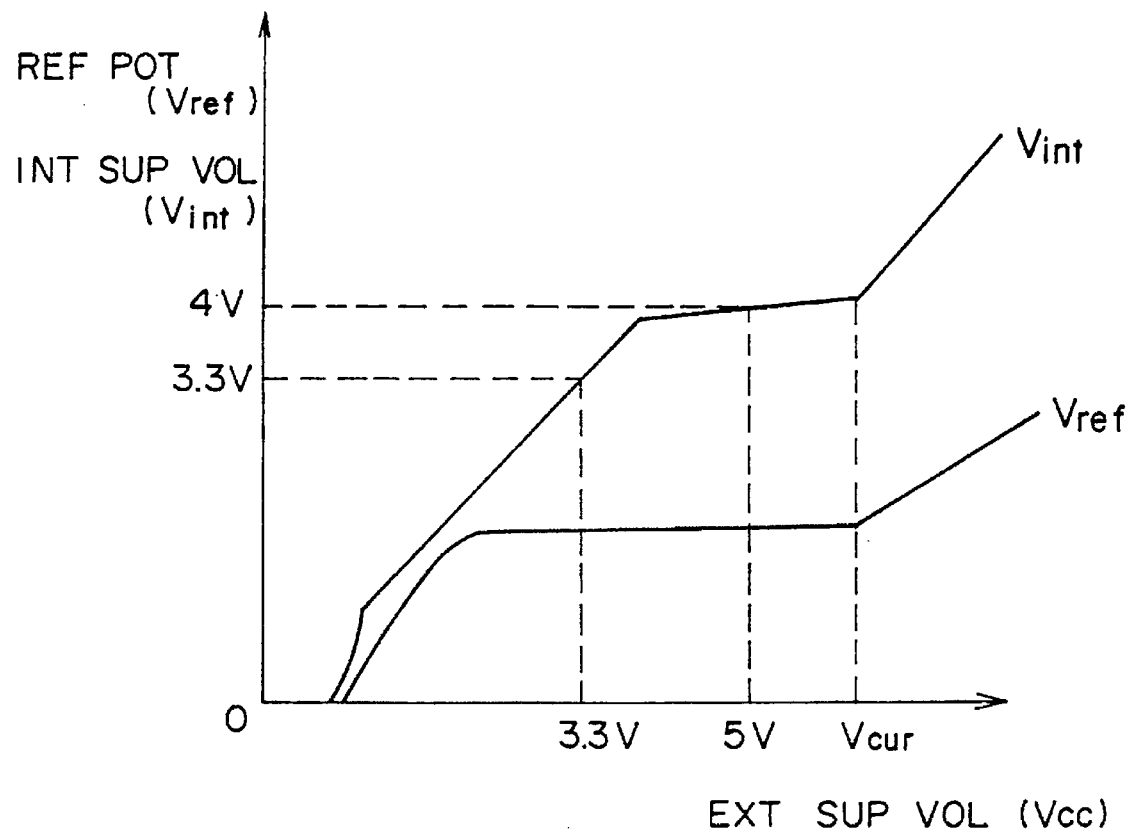
FIG. 23 is a graphical representation showing the relationship between the external supply voltage and the reference potential, the internal supply voltage of the prior art semiconductor device shown in FIG. 21.

As a result, the source of the N-channel transistor N12 of the differential amplifier 10 is grounded, so that the circuit operates in the same way as with the case of the circuit as shown in FIG. 21. In more detail, the reference potential $V_{ref}$ generated by the reference potential generating circuit 11 and the potential $V_A$ obtained by dividing the potential difference between the external supply voltage Vcc and the ground potential Vss by the P-channel transistor P13 and the resistor R11, and the resistor R12 are both inputted to the differential amplifier 10. Therefore, the P-channel transistor P13 is controllably turned on or off according to the relative potential difference between the two, with the result that a constant deboosted internal supply voltage $V_{int}$ can be outputted.

On the other hand, when the external supply voltage Vcc is lower than a predetermined value (e.g., 3.3 V), the device operates as follows: the bonding pad 12a of the control circuit 12, the bonding pad 13 to which the external supply voltage Vcc is supplied, and the bonding pad 14 for outputting the internal supply voltage $V_{int}$ are all shorted by a bonding wire provided manually, so that all the potentials of these bonding pads 12a, 13 and 14 are equal to the external supply voltage Vcc.

That is, in the control circuit 12, since the potential level of the bonding pad 12a is equal to the external supply voltage Vcc, the output potential $V_{SSG}$ of the second inverter composed of the P-channel transistor P15 and the N-channel transistor N15 changes to the external supply voltage Vcc. Therefore, since the external supply voltage Vcc is supplied to the source of the N-channel transistor N12 of the differential amplifier 10, the differential amplifier is deactivated without passing any consumed current. Further, no current flows through the reference potential generating circuit 11 and the two resistors R11 and R12. Here, although the N-channel transistor N13 is turned on, since the dimensions of this transistor N13 are determined small, the consumed current is sufficiently small to be negligible.

As described above, in this first embodiment, when the external supply voltage Vcc is low, the control circuit 12 deactivates the differential amplifier 10 to cut off the consumed current passing therethrough.

Figure 6:
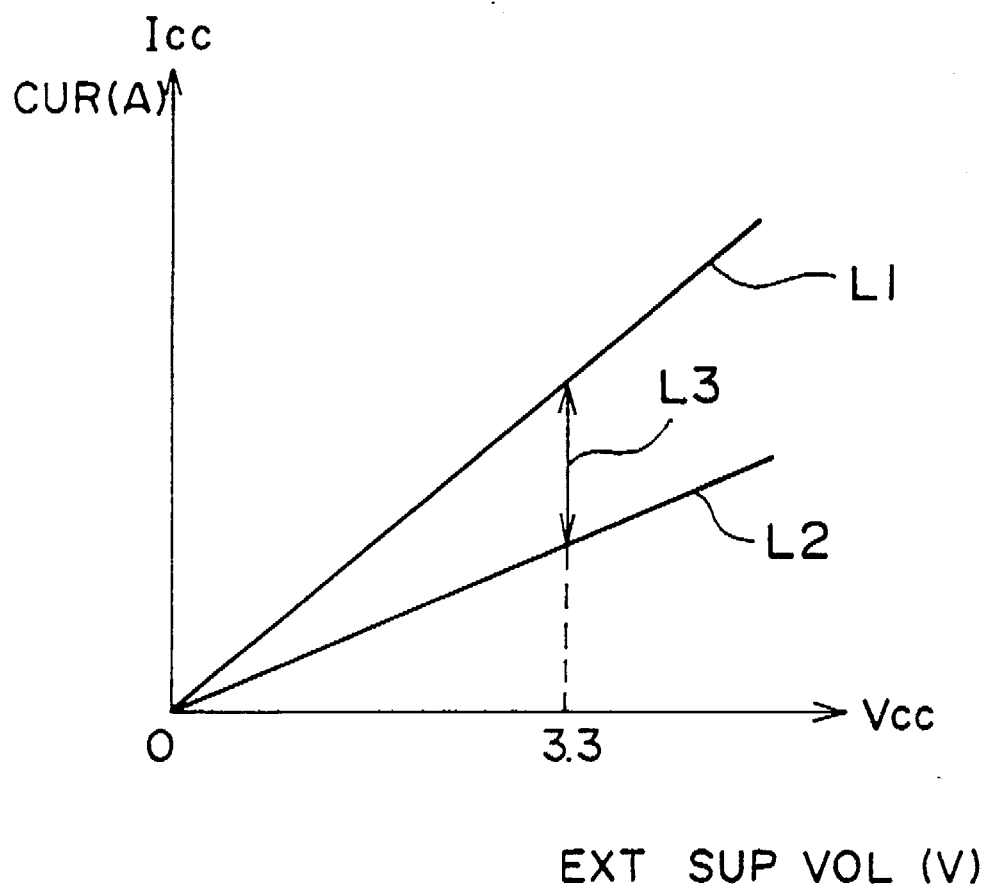
FIG. 6 is a graphical representation showing the relationship between the external supply voltage and the stand-by current.

FIG. 6 shows the relationship between the external supply voltage Vcc and the consumed current Icc during the stand-by condition, in which the line L1 denotes the current of the prior art device and the line L2 denotes the current of the device of the present invention. In the case of the prior art device, since the differential amplifier 10 and the P-channel transistor P13 are activated even when the external supply voltage Vcc is as low as 3.3 V, the consumed current is large during the stand-by condition, as shown by the line L1. In contrast with this, in the case of the device according to the present invention, since the differential amplifier 10 and the P-channel transistor P13 are both not activated when the external supply voltage Vcc is as low as 3.3 V, it is possible to reduce the stand-by current $I_{cc}$ markedly, as shown by the line L2, so that it is possible to increase the battery backup time of the portable electronic apparatus.

Further, in the case of the prior art device, when the external supply voltage Vcc is low, a voltage lower than the external supply voltage Vcc is outputted as the internal supply voltage $V_{int}$ due to the presence of the resistance of the P-channel transistor P13. In the case of the present embodiment, however, since the external supply voltage Vcc is supplied to the bonding pad 14, the external supply voltage Vcc is outputted as it is as the internal supply voltage $V_{int}$ without deboosting, thus preventing delayed access time being and reduced operational margin.

Further, since the P-channel transistor P13 for driving the internal supply voltage $V_{int}$ is activated only when the external supply voltage Vcc is high, it is possible to suppress the generation of switching noise by determining the dimensions of the transistor P13 to optimum values.

Figure 2:
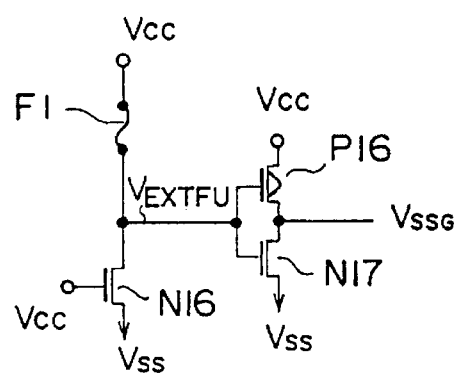
FIG. 2 is a circuit diagram showing another circuit configuration of the control circuit of the first embodiment of the semiconductor device shown in FIG. 1.

FIG. 2 shows a modification of the control circuit 12 of the first embodiment. In this modification, a fuse F1 and an N-channel transistor N16 are connected in series between the external supply voltage (Vcc) terminal and the ground voltage (Vss) terminal. The external supply voltage Vcc is supplied to the gate of an N-channel transistor N16. A node between the fuse F1 and the drain of the N-channel transistor N16 is connected to the input terminal of an inverter composed of a P-channel transistor P16 and an N-channel transistor N17. Further, a potential $V_{SSG}$ is outputted from the output terminal of the inverter P16 and N17.

When the external supply voltage Vcc is high, the device is used under the condition as shown in FIG. 2. In this case, the potential $V_{EXTFU}$ at the node between the fuse F1 and the drain of the N-channel transistor N16 is at a high level. This potential $V_{EXTFU}$ is inverted by the inverter composed of the P-channel transistor P16 and the N-channel transistor N17, so that a low level potential $V_{SSG}$ is outputted. In response to this low level potential, the differential amplifier 10 is activated to output a deboosted internal supply voltage $V_{int}$.

When the external supply voltage Vcc is low, the fuse F1 is melted off. Therefore, the potential $V_{EXTFU}$ is at the low level, so that the potential $V_{SSG}$ is at the high level. With the result, the differential amplifier 10 is deactivated.

Figure 3:
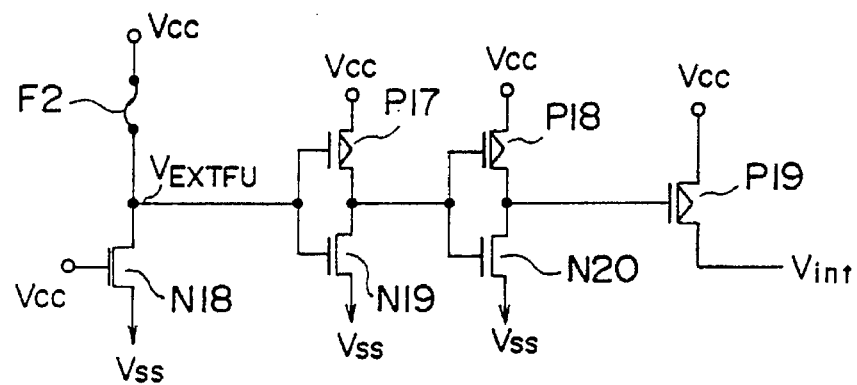
FIG. 3 is a circuit diagram showing still another circuit configuration of the control circuit of the same semiconductor device shown in FIG. 1.

FIG. 3 shows an example of the circuit for outputting the external supply voltage Vcc as the internal supply voltage $V_{int}$ by melting off the fuse when the external supply voltage Vcc is low. A fuse F2 and an N-channel transistor N18 are connected in series between the external supply voltage (Vcc) terminal and the ground voltage (Vss) terminal. A node between the fuse F2 and the transistor N18 is connected to the input terminal of a two-stage inverter of a first inverter composed of a P-channel transistor P17 and an N-channel transistor N19 and a second inverter composed of a P-channel transistor P18 and an N-channel transistor N20. The output terminal of the second inverter composed of the P-channel transistor P18 and the N-channel transistor N20 is connected to the gate of a P-channel transistor P19. The drain of the P-channel transistor P19 is connected to the external supply voltage (Vcc) terminal, and the source thereof is connected to the internal supply voltage ($V_{int}$) terminal, respectively.

In this circuit as shown in FIG. 3, when the external supply voltage Vcc is high, the fuse F2 is not melted off, so that the circuit operates under the condition as shown in FIG. 3. The potential $V_{EXTFU}$ is at a high level, and the high level output is applied to the gate of the P-channel transistor P19 via the two-stage inverters to turn off the P-channel transistor P19, so that the external supply voltage (Vcc) terminal is disconnected from the internal supply voltage ($V_{int}$) terminal.

When the external supply voltage Vcc is low, the fuse F2 is melted off, so that the potential $V_{EXTFU}$ is at a low level, and the low level output is applied to the gate of the P-channel transistor P19 via the two-stage inverters to turn on the P-channel transistor P19, so that the external supply voltage (Vcc) terminal is connected to the internal supply voltage ($V_{int}$) terminal. When the dimensions of the P-channel transistor P19 are determined as large as possible, it is possible to output the internal supply voltage $V_{int}$ roughly equal to the external supply voltage Vcc.

Further, although the N-channel transistor N18 is kept turned on, since the dimensions thereof are determined to be small, it is possible to suppress the consumed current passed therethrough to such an extent as to be negligible.

Accordingly, in the case where the circuits as shown in FIGS. 2 and 3 are combined, when the external supply voltage Vcc is low, it is possible to cut off the consumed current passing through the differential amplifier 10 and the P-channel transistor P13 and in addition to output the external supply voltage Vcc as the internal supply voltage $V_{int}$ (without deboosting the voltage Vcc) by melting off the fuses F1 and F2.

Figure 4:
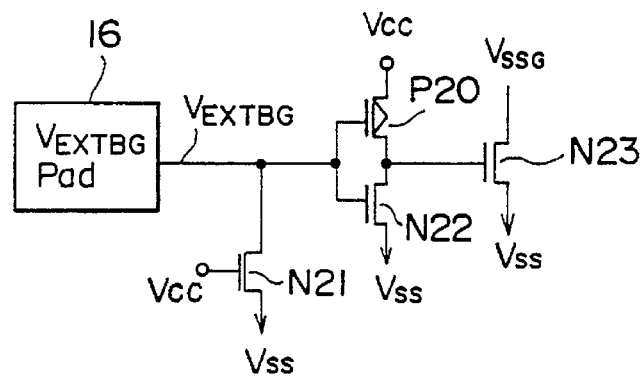
FIG. 4 is a circuit diagram showing another circuit configuration of the control circuit of the same semiconductor device.

FIG. 4 shows another modification of the control circuit 12 shown in FIG. 1. In the case of the control circuit 12 shown in FIG. 1, the operation of the differential amplifier 10 is controlled by changing the level of the potential $V_{SSG}$. In contrast with this, in the control circuit as shown in FIG. 4, the operation of the differential amplifier 10 can be controlled by controlling the conduction status of the transistor connected between the potential ($V_{SSG}$) terminal and the ground voltage (Vss) terminal.

An N-channel transistor N21 is connected between a bonding pad 16 and the ground voltage (Vss) terminal. Further, the bonding pad 16 is connected to an input terminal of an inverter composed of a P-channel transistor P20 and an N-channel transistor N22. The output terminal of this inverter is connected to the gate of an N-channel transistor N23. The drain of this transistor N23 is connected to the potential ($V_{SSG}$) terminal and the source thereof is grounded. When the external supply voltage Vcc is high, the bonding pad 16 is disconnected from the other bonding pads. Since the N-channel transistor N21 is turned on, the voltage $V_{EXTBG}$ is at a low level, so that a high level output inverted by the inverter P20 and N22 is inputted to the gate of the N-channel transistor N23 to turn on the N-channel transistor N23. Therefore, the voltage $V_{SSG}$ is roughly equal to the ground level, so that the differential amplifier 10 is activated.

When the external supply voltage Vcc is low, the bonding pad 16 is connected to the other bonding pads 13 and 14 shown in FIG. 1 by use of bonding wire, so that the external supply voltage Vcc is supplied. Since the voltage $V_{EXTBG}$ is at the high level, the high level voltage $V_{EXTBG}$ is inverted to the low level by the inverter and then inputted to the gate of the N-channel transistor N23 to turn off the N-channel transistor N23. As a result, the source of the N-channel transistor N12 of the differential amplifier 10 is not grounded, so that the differential amplifier 10 is deactivated.

Figure 5:
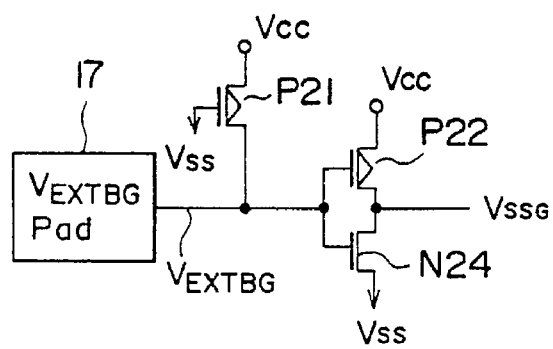
FIG. 5 is a circuit diagram showing still another circuit configuration of the control circuit of the same semiconductor device.

FIG. 5 shows still another modification of the control circuit 12 shown in FIG. 1. A P-channel transistor P21 is connected between the external supply voltage (Vcc) terminal and a bonding pad 17. The bonding pad 17 is connected to the input terminal of an inverter composed of a P-channel transistor P22 and an N-channel transistor N24. The voltage $V_{SSG}$ is outputted from the output terminal of this inverter.

When the external supply voltage Vcc is high, the bonding pad 17 is disconnected from the other bonding pads in the same way as the circuit shown in FIG. 4. The voltage $V_{EXTBG}$ is at a high level because the P-channel transistor P21 (whose gate is grounded) is turned on. This high level voltage $V_{EXTBG}$ is inverted by the inverter and then outputted as the low level potential output $V_{SSG}$, so that the differential amplifier 10 shown in FIG. 1 is activated.

When the external supply voltage Vcc is low, the bonding pad 17 is connected to the grounded bonding pad 15. Therefore, the voltage $V_{EXTBG}$ is at the low level. This low level voltage $V_{EXTBG}$ is inverted by the inverter and then outputted as the high level potential output $V_{SSG}$, so that the differential amplifier 10 shown in FIG. 1 is deactivated.

A second embodiment of the semiconductor device according to the present invention will be described hereinbelow. The feature of this second embodiment is that the conductive resistance of the transistor for driving the external supply voltage is controlled according to the magnitude of the external supply voltage Vcc.

FIG. 7 shows the second embodiment of the semiconductor device according to the present invention. The semiconductor device is provided with a reference potential generating circuit 40 and two circuits 20 and 30 similar to each other.

The referential potential generating circuit 40 outputs a reference potential $V_{ref}$.

The circuit 20 operates only when the external supply voltage Vcc is lower than a predetermined value (e.g., 3.3 V), and is composed of a detection circuit 21, a level shifter 22, a differential amplifier 23, a driving transistor section 24, a P-channel transistor P41 for dividing voltage by resistance, and two resistors R21 and R22. The circuit 30 always operates irrespective of the external supply voltage Vcc, and is composed of a detection circuit 31, a level shifter 32, a differential amplifier 33, a driving P-channel transistor P47, a P-channel transistor P48 for dividing voltage by resistance, and two resistors R23 and R24.

In the circuit 20, the detection circuit 21 detects the level of the external supply voltage Vcc and outputs a detection signal $V_{CCMIN}$. The level shifter 22 is composed of P-channel transistors P31 and P32, N-channel transistors N31 and N32, a P-channel transistor P33, and an inverter IN11, and transforms the detection signal $V_{CCMIN}$ to any desired voltage level between V21 to V23.

The transistor section 24 includes a plurality of P-channel transistors P101 to P10n (n: two or more integers) connected in parallel to each other between the external supply voltage (Vcc) terminal and the internal supply voltage ($V_{int}$) terminal. These P-channel transistors P101 to P10n output the internal supply voltage $V_{int}$ from the drains thereof in response to a voltage V21 applied to the gates thereof in common.

The P-channel transistor P41 and the two resistors R21 and R22 are connected in series between the internal supply voltage ($V_{int}$) terminal and the output terminal of the inverter IN11 for outputting the voltage V23. Here, the P-channel transistor P41 is turned on or off according to the voltage V23 applied to the gate thereof. Further, a voltage V24 is outputted from a node between the two resistors R21 and R22. This voltage V24 is obtained by dividing the voltage difference ($V_{int}$–V23) between the internal supply voltage $V_{int}$ and the voltage V23 by these resistors R21 and R22.

The differential amplifier 23 is of current mirror type, which is composed of P-channel transistors P34 and P35 and N-channel transistors N33 to N36. Being controlled by a voltage V22, the differential amplifier 23 compares the reference voltage $V_{ref}$ and the voltage V24, and output a voltage V21 to control the operation of the driving transistor section 24.

The circuit 30 is similar in circuit configuration to the circuit 20 described above. However, this circuit 30 always operates irrespective of the level of the external supply voltage Vcc. Therefore, the detection circuit 31 for detecting the external supply voltage Vcc and the level shifter 32 are not necessarily needed. That is, any circuit can be adopted when the differential amplifier 33 always operates and in addition the switching operation of the P-channel transistors P47 can be controlled according to the comparison result between the reference voltage $V_{ref}$ and a voltage V31.

The circuit shown in FIG. 7 operates as follows: When the external supply voltage Vcc is as low as 3.3 V, for instance, the circuits 20 and 30 both operate together. In the circuit 20, the detection circuit 21 detects that the external supply voltage Vcc is lower than a predetermined value, and outputs a control signal $V_{CCMIN}$ indicative of a low external supply voltage. On the basis of this control signal $V_{CCMIN}$, the level shifter 22 outputs voltages V21 to V23, respectively. The logical levels of the voltage V21 and V23 are both at a low level, and that of the voltage V22 is at a high level.

In response to the low level voltage V21, the P-channel transistors P101 to P10n of the transistor section 24 are turned on to output the internal supply voltage $V_{int}$ deboosted according to the conductive resistance of these transistors. Further, the potential difference between the internal supply voltage $V_{int}$ and the voltage V23 is divided by the P-channel transistor P41 and the resistor R21, and the resistor R22 to output the voltage V24.

In response to the high level voltage V22, the differential amplifier 23 is activated to compare the reference voltage $V_{ref}$ with the voltage V24. When the voltage V24 is higher than the reference voltage $V_{ref}$, a high level voltage V21 is outputted to turn off the P-channel transistors P101 to p10n, so that the level of the internal supply voltage $V_{int}$ drops. When the voltage V24 is lower than the reference voltage $V_{ref}$, a low level voltage V21 is outputted to turn on the P-channel transistors P101 to P10n, so that the level of the internal supply voltage $V_{int}$ rises.

In the circuit 30, the detection circuit 31, the level shifter 32 and the differential amplifier 33 operate in the same way.

The detection circuit 31 detects the level of the external supply voltage Vcc and outputs a control signal $V_{CCMAX}$. Here, the control signal $V_{CCMAX}$ is always at the high level to activate the differential amplifier 33. The control signal $V_{CCMAX}$ is inverted by the inverter IN12 to the low level signal. The potential difference between the external supply voltage Vcc and the inverted low-level control signal/ $V_{CCMAX}$ is divided by the P-channel transistors P47 and P48 and the resistors R23 and R24, then outputted as a potential V31. The differential amplifier 33 compares this potential V31 with the reference potential $V_{ref}$ to control the conduction of the P-channel transistor P47 according to the comparison result.

In the circuit 20, when the external supply voltage Vcc is lower than a predetermined value, since the P-channel transistors P101 to P10n are all turned on and therefore connected in parallel to each other, the dimensions of the driving transistors for generating the internal supply voltage $V_{int}$ increase. Accordingly, it is possible to generate the internal supply voltage $V_{int}$ without deboosting the external supply voltage Vcc. In particular, since the dimensions of the driving transistors can be increased by increasing the number of the P-channel transistors P101 to P10n of the transistor section 24, it is possible to obtain such a status that the external supply voltage (Vcc) terminal is roughly connected to the internal supply voltage ($V_{int}$) terminal.

When the external supply voltage Vcc is as high as 5 V, for instance, the circuit 20 operates as follows: The detection circuit 21 detects that the external supply voltage Vcc is higher than a predetermined value. Here, since the control signal $V_{CCMIN}$ is at the low level, the low level potential V22 is given to the differential amplifier 23 to deactivate the differential amplifier 23. Further, since the high level potential V23 is inputted to the P-channel transistor P41, the P-channel transistor 41 is turned off. Further, since the output potential V21 of the differential amplifier 23 is at the high level, all the P-channel transistors P101 to P10n are turned off.

On the other hand, since the circuit 30 is being activated even when the external supply voltage Vcc is high, the internal supply voltage $V_{int}$ is outputted from the P-channel transistor P47. As described above, when the external supply voltage Vcc is high, only the P-channel transistor P47 is turned on. Accordingly, it is possible to determine the conductive resistance of the driving transistor for outputting the internal supply voltage $V_{int}$ to be large, thus suppressing noise generated in switching operation to improve the operation margin.

As described above, in the second embodiment, the conductive resistance of the transistors for outputting the internal supply voltage $V_{int}$ is controlled according to the external supply voltage Vcc. That is, when the external supply voltage Vcc is low, the conductive resistance thereof is determined to be small to output the internal supply voltage $V_{int}$ roughly equal to the external supply voltage Vcc. When the external supply voltage Vcc is high, on the other hand, the conductive resistance thereof is determined to be large to suppress switching noise, so that it is possible to secure the high operation margin.

Figure 8:
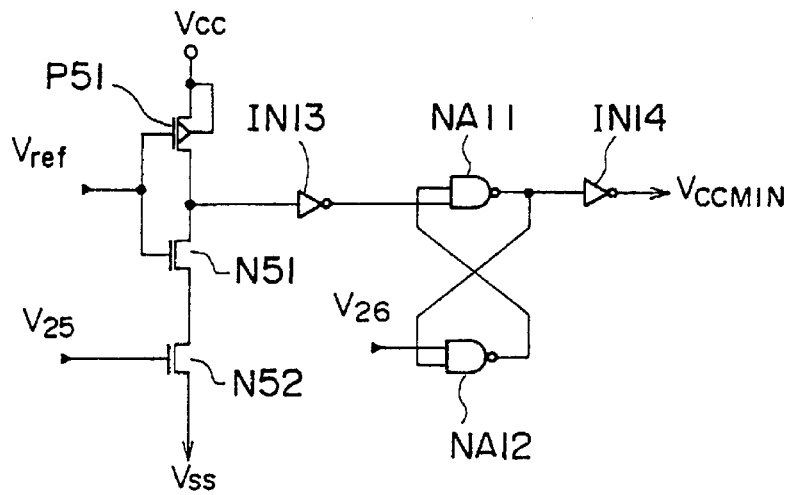
FIG. 8 is a circuit diagram showing another circuit configuration of the detecting circuit of the same semiconductor device shown in FIG. 7.

FIG. 8 shows an actual circuit of this detection circuit 21 of the second embodiment. An inverter composed of a P-channel transistor P51 and an N-channel transistor N51, and an N-channel transistor N52 are connected in series between the external supply voltage (Vcc) terminal and the ground voltage (Vss) terminal. A reference potential $V_{ref}$ not subjected to the influence of the external supply voltage Vcc is inputted to the input terminal of this inverter, and a high level signal V25 is inputted to the gate of the N-channel transistor N52. The output terminal of this inverter P51 and N51 is connected to the input terminal of an inverter IN13. The output terminal of this inverter IN13 is connected to the set terminal of a R-S latch circuit composed of NAND circuits NA11 and NA12. A low level signal V26 is applied to the reset terminal of this latch circuit when activated. An auxiliary output terminal of the latch circuit is connected to an output terminal via an inverter IN14 to output a control signal $V_{CCMIM}$.

In this detection circuit, the level of the control signal $V_{CCMIM}$ is controlled according to the resistance ratio of the transistors P51, N51 and N52.

Figure 9:
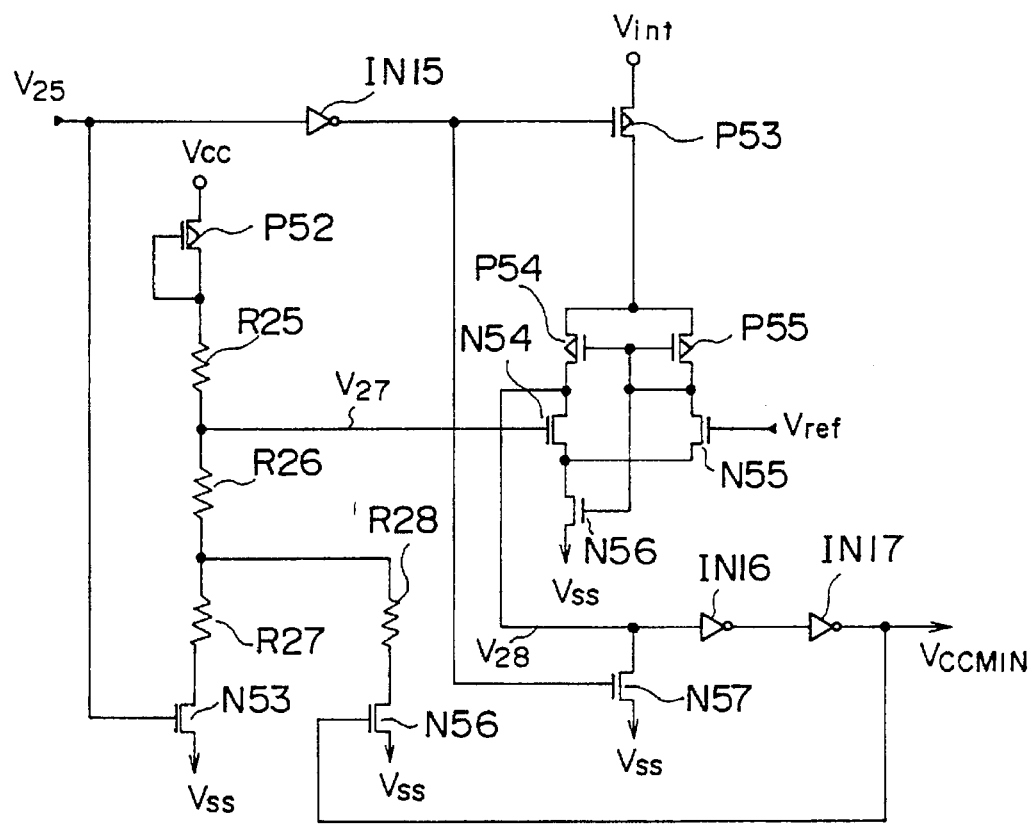
FIG. 9 is a circuit diagram showing still another circuit configuration of the detecting circuit of the same semiconductor device shown in FIG. 7.

FIG. 9 shows another example of the detection circuit 21 of the second embodiment, which uses a CMOS-type current mirror circuit. A P-channel transistor P52, resistors R25 to R27 and an N-channel transistor N53 are connected in series between the external supply voltage (Vcc) terminal and the ground voltage (Vss) terminal. The voltage difference between Vcc and Vss is divided by a first resistance group (the P-channel transistor P52 and the resistor R25) and a second resistance group (the resistors R26 and R27 and the N-channel transistor N53), so that a potential V27 is generated from a node between the two resistors R25 and R26.

The differential amplifier is composed of P-channel transistors P54 and P55 and N-channel transistors N54 to N56. The operation of the differential amplifier is controlled by the operating condition of a P-channel transistor P53 connected between the internal supply voltage ($V_{int}$) terminal and the sources of the P-channel transistors P54 and P55. This P-channel transistor P53 is turned on or off in response to a voltage V25 supplied to the gate thereof via an inverter IN15.

The potential V27 and the reference voltage $V_{ref}$ are inputted to the differential amplifier, and the comparison result between the two is outputted as a potential V28. This potential V28 is outputted via an inverter train composed of two inverters IN16 and IN17 as a control signal $V_{CCMIN}$. Further, an N-channel transistor N57 whose gate is connected to the output terminal of the inverter IN15 is connected between the potential V28 and the ground voltage (Vss) terminal. Further, a resistor R28 and an N-channel transistor N56 are connected in series between a node of the resistors R26 and R27 and the ground voltage (Vss) terminal. The conduction of this N-channel transigtor N56 is controlled on the basis of the control signal $V_{CCMIN}$. In the detection circuit constructed as described above, it possible to detect the magnitude of the external supply voltage Vcc by comparing the voltage V27 obtained by dividing the external supply voltage Vcc through resistances with the reference potential $V_{ref}$.

Further, in this detection circuit as shown in FIG. 9, the potential is different between when the external supply voltage Vcc is switched from the high level to the low level and when switched from the low level to the high level; that is, this detection circuit is provided with hysteresis characteristics. Accordingly, it is possible to secure the reliable operation even if the manufacturing process conditions fluctuate and thereby the reference level for discriminating the magnitude of the external supply voltage Vcc is offset slightly.

Figure 10:
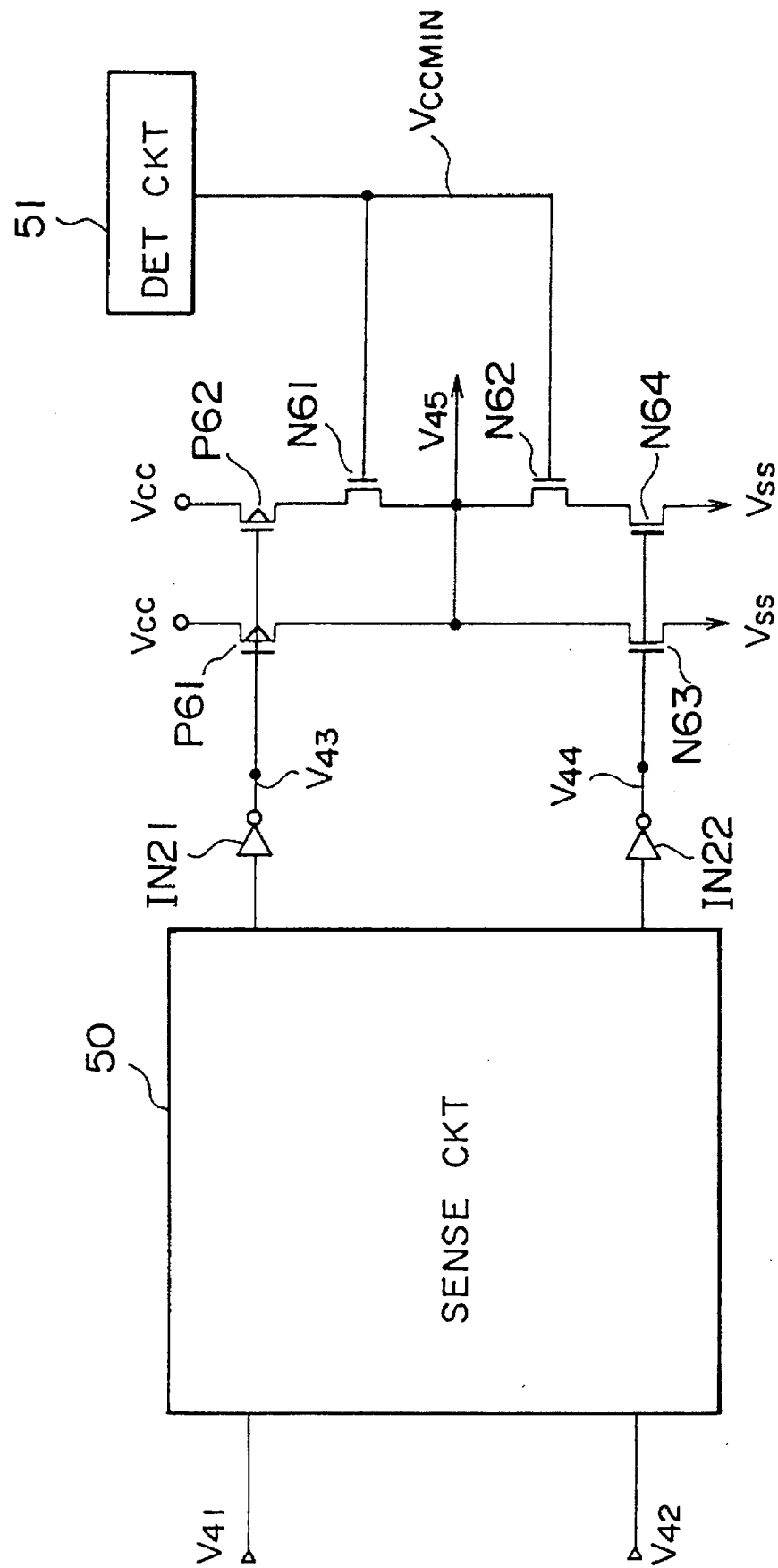
FIG. 10 is a circuit diagram showing a third embodiment of the semiconductor device according to the present invention.

A third embodiment of the semiconductor device according to the present invention will be described hereinbelow with reference to FIG. 10. In this device, a mutual potential difference between two voltages V41 and V42 on a pair of bit lines is detected by a sense circuit 50 and then outputted from output transistors. Here, the feature of this third embodiment is that the dimensions of the output transistors are controlled according to the level of the external supply voltage Vcc.

The output transistors are P-channel transistors P61 and P62 and N-channel transistors N63 and N64. The P-channel transistor P61 and the N-channel transistor N63 are connected in series between the external supply voltage (Vcc) terminal and the ground voltage (Vss) terminal. The P-channel transistor P62 and the N-channel transistor N64 are connected in series via two N-channel transistors N61 and N62 between the external supply voltage (Vcc) terminal and the ground voltage (Vss) terminal. The gates of the P-channel transistors P61 and P62 are connected in common to one output terminal of the sense circuit 50 via an inverter IN21, and the gates of the N-channel transistors N63 and N64 are connected in common to the other output terminal of the sense circuit 50 via an inverter IN22. Further, an output terminal of a detection circuit 51 is connected to the gates of the N-channel transistors N61 and N62 respectively, to control the conduction of these transistors on the basis of the control signal $V_{CCMIN}$. Further, an output terminal V45 of this semiconductor device is connected to a common node between the P-channel transistor P61 and the N-channel transistor N63 and between the N-channel transistors N61 and N62.

The magnitude of the external supply voltage Vcc is detected by the detection circuit 51. When the external supply voltage Vcc is low, the control signal $V_{CCMIN}$ is at a high level, so that the N-channel transistor N61 and the N-channel transistor N62 are both turned on. Accordingly, the output P-channel transistors P61 and P62 and N-channel transistors N63 and N64 are all turned on, with the result that the conductive resistance thereof decreases. In other words, when the external supply voltage Vcc is low, the dimensions of the final stage output transistors increase, so that it is possible to prevent the output level from being lowered.

In contrast with this, when the external supply voltage Vcc is high, the control signal $V_{CCMIN}$ is at a low level, so that the N-channel transistors N61 and N62 are both turned off and further the P-channel transistor P62 and the N-channel transistor N64 are both turned off. That is, since the output transistors are composed of only the P-channel transistor P61 and the N-channel transistor N63, the conductive resistance thereof increases, so that it is possible to suppress switching noise even if the external supply voltage Vcc is high.

Figure 11:
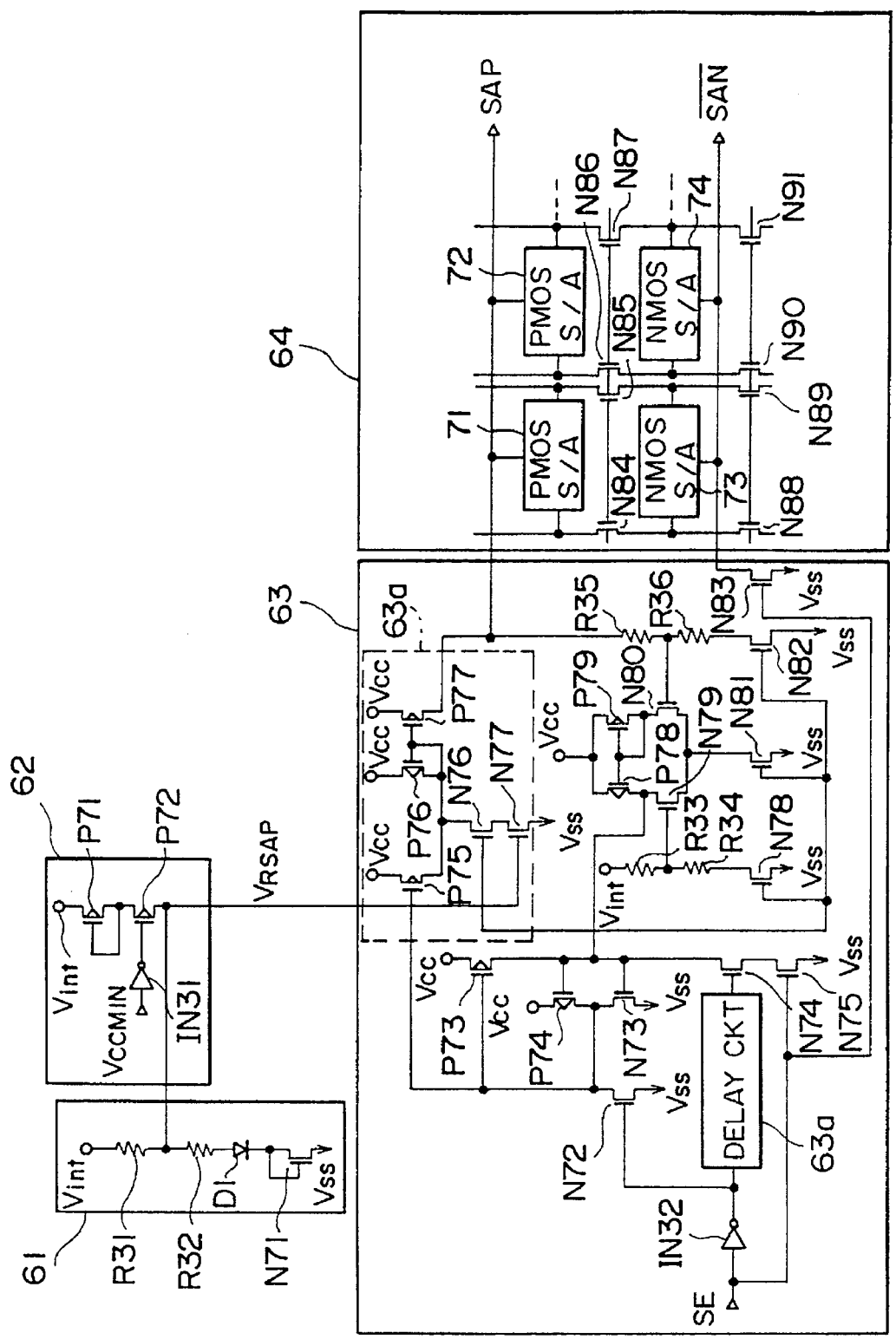
FIG. 11 is a circuit diagram showing a fourth embodiment of the semiconductor device according to the present invention.

A fourth embodiment of the semiconductor device according to the present invention will be described hereinbelow with reference to FIG. 11. This semiconductor device is provided with a constant current deboosting circuit for driving a common source node of a sense amplifier.

The sense amplifier circuit 64 includes two P-channel sense amplifiers 71 and 72 composed of P-channel transistors and two N-channel sense amplifiers 73 and 74 composed of N-channel transistors. The P-channel sense amplifiers 71 and 72 are activated by charging a common source node SAP of the P-channel transistors. On the other hand, the N-channel sense amplifiers 73 and 74 are activated by discharging a common source node /SAN of the N-channel transistors.

The above-mentioned charge and discharge at the common source nodes SAP and /SAN are controlled by a control circuit 63. In more detail, the common source node SAP of the P-channel transistors 71 and 72 are charged by a circuit 63a composed of P-channel transistors P75 to P77 and N-channel transistors N76 and N77.

The circuit 63a operates on the basis of a comparison result between the reference potential $V_{RASP}$ inputted to the gate of the N-channel transistor N77 and the potential at the common source node SAP. The reference potential $V_{RSAP}$ is generated by a reference potential generating circuit 61. In the reference potential generating circuit 61, two resistors R31 and R32, a diode D1, and an N-channel transistor N71 are connected in series between the internal supply voltage ($V_{int}$) terminal and the ground voltage (Vss) terminal. The reference potential $V_{RSAP}$ is generated by dividing the internal supply voltage $V_{int}$ by a first resistance of the resistor R31 and a second resistance of the resistor R32, the diode D1 and the N-channel transistor N71.

The level of this reference potential $V_{RASP}$ is switched according to the operation of a reference potential control circuit 62. The reference potential control circuit 62 is composed of P-channel transistors P71 and P72 connected in series between the internal supply voltage ($V_{int}$) terminal and a voltage ($V_{RASP}$) terminal. The P-channel transistor P72 is controllably turned on or off on the basis of the control signal $V_{CCMIN}$ outputted from the detection circuit 21 shown in FIG. 7 and further inverted by an inverter IN31.

When the external supply voltage Vcc is low, the detection signal $V_{CCMIN}$ is at a high level. This detection signal $V_{CCMIN}$ is inverted by the inverter IN31 into a low level and then applied to the gate of the P-channel transistor P72 to turn on the transistor P72, so that the internal supply voltage ($V_{int}$) terminal is shorted to the reference potential ($V_{RSAP}$) terminal via the P-channel transistors P71 and P72. Therefore, the reference potential $V_{RASP}$ becomes roughly equal to the internal supply voltage $V_{int}$, for instance 3.3 V. The reference potential $V_{RSAP}$ is inputted to the gate of the N-channel transistor N77 to increase the speed of charging the common source node SAP.

In contrast with this, when the external supply voltage Vcc is high, the P-channel transistor P72 is turned off, so that the internal supply voltage ($V_{int}$) terminal is not shorted to the reference potential ($V_{RSAP}$) terminal. Therefore, the reference potential $V_{RASP}$ is determined by the reference potential generating circuit 61 to such a low level as 1.4 V, for instance. The reference potential $V_{RSAP}$ is inputted to the gate of the N-channel transistor N77 to reduce the noise level generated in switching operation.

As described above, when the external supply voltage Vcc is low, the reference potential $V_{RSAP}$ is determined as high as 3.3 V, for instance to increase the charging speed at the common source node SAP, so that it is possible to prevent the delay of restoring operation on the bit lines. Further, when the external supply voltage Vcc is high, the reference potential $V_{RSAP}$ is determined as low as 1.4 V, for instance to decrease the charging speed at the common source node SAP, so that it is possible to reduce supply voltage noise generated when the common source node SAP is being charged and thereby to prevent the erroneous operation.

Fifth to seventh embodiments of the semiconductor device according to the present invention will be described hereinbelow. In these embodiments, the reference potential $V_{ref}$ is generated by switching the level thereof according to the magnitude of the external supply voltage Vcc. The generated reference voltage $V_{ref}$ is used as the reference voltage compared with the I/O input level or for a precharge voltage (½ Vcc) generating circuit for bit lines of a DRAM.

Figure 12:
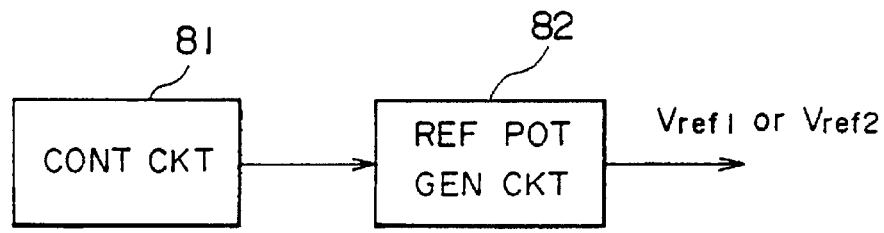
FIG. 12 is a circuit diagram showing a fifth embodiment of the semiconductor device according to the present invention.

FIG. 12 shows the fifth embodiment of the present invention, which is composed of a control circuit 81 and a reference potential generating circuit 82. The control circuit 81 outputs a control signal according to the magnitude of the external supply voltage Vcc. This control signal is given to the reference potential generating circuit 82. The reference potential generating circuit 82 outputs a reference potential $V_{ref1}$ when the external supply voltage Vcc is high, and another reference potential $V_{ref2}$ when the external supply voltage Vcc is low.

Figure 13:
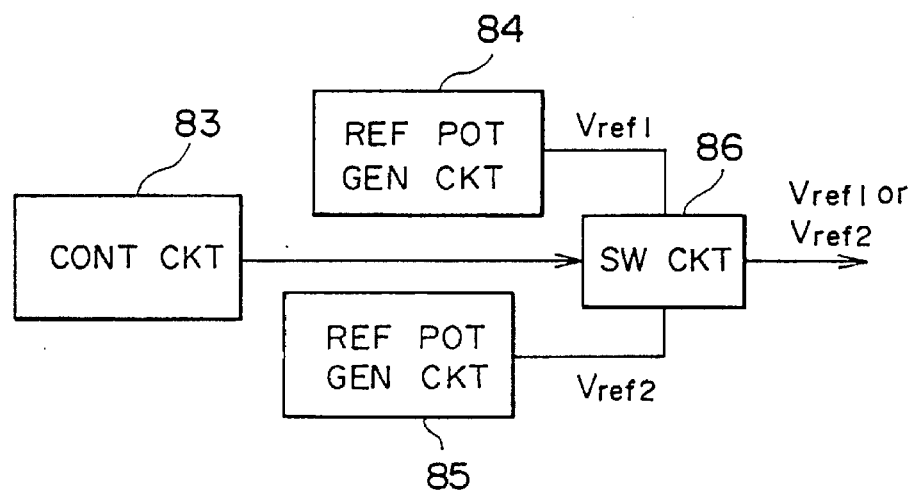
FIG. 13 is a circuit diagram showing a sixth embodiment of the semiconductor device according to the present invention.

FIG. 13 shows the sixth embodiment of the present invention, which is composed of a control circuit 83, a first reference potential generating circuit 84 for generating a first reference potential $V_{ref1}$, a second reference potential generating circuit 85 for generating a second reference potential $V_{ref2}$, and a switching circuit 86. The outputs of the two reference potential generating circuits 84 and 85 are given to the switching circuit 86. One of the two reference potentials is selected on the basis of a control signal applied from the control circuit 83.

Figure 14:
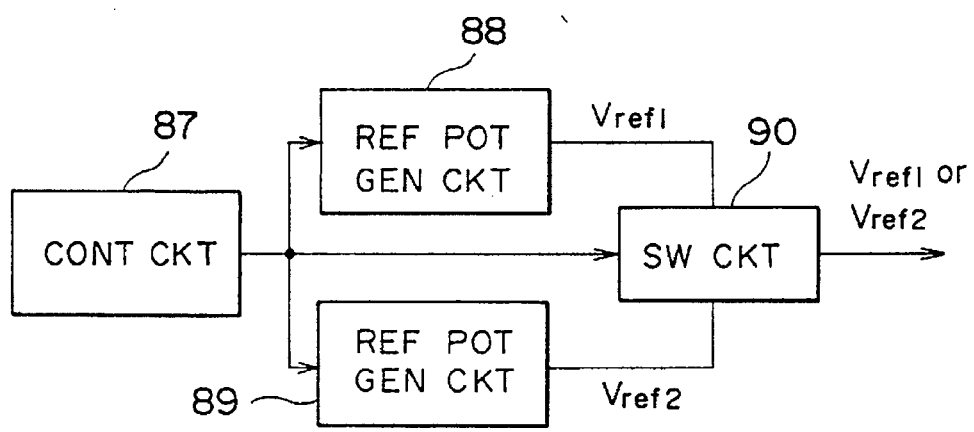
FIG. 14 is a circuit diagram showing a seventh embodiment of the semiconductor device according to the present invention.

FIG. 14 shows the seventh embodiment of the present invention, which is composed of a control circuit 87, a first reference potential generating circuit 88 for generating a first reference potential $V_{ref1}$, a second reference potential generating circuit 89 for generating a second reference potential $V_{ref2}$, and a switching circuit 90. The operation of the reference potential generating circuit 88 or 89 is controlled on the basis of a control signal given by the control circuit 87, respectively, being different from the sixth embodiment shown in FIG. 13. In more detail, when the external supply voltage Vcc is high, only the first reference potential generating circuit 88 is activated on the basis of the control signal to generate the first reference potential $V_{ref1}$, without activating the second reference potential generating circuit 89. The generated first reference signal $V_{ref1}$ is inputted to the switching circuit 90 and then outputted to the outside. On the other hand, when the external supply voltage Vcc is low, only the second reference potential generating circuit 89 is activated on the basis of the control signal to generate the second reference potential $V_{ref2}$, without activating the first reference potential generating circuit 88. The generated second reference signal $V_{ref2}$ is inputted to the switching circuit 90 and then outputted to the outside. In this embodiment, since either one of the two reference potential generating circuits 88 and 89 is activated, it is possible to reduce the current consumption as compared with the sixth embodiment shown in FIG. 13.

As described above, it is possible to generate an appropriate reference potential (which is low when the external supply voltage is low but high when the external supply voltage is high) by controlling the reference potential $V_{ref}$ according to the magnitude of the external supply voltage Vcc.

FIGS. 15 to 17 show eighth to tenth embodiments of the semiconductor device according to the present invention. In these embodiments, either one of the substrate potentials $V_{SSB1}$ and $V_{SSB2}$ is outputted according to the magnitude of the external supply voltage Vcc. The circuit configurations thereof are basically the same as with the cases of the fifth to seventh embodiments shown in FIGS. 12 to 14, respectively.

In the case of the eighth embodiment shown in FIG. 15, a substrate potential generating circuit 92 outputs either one of the substrate potentials $V_{SSB1}$ and $V_{SSB2}$ on the basis of a control signal applied by a control circuit 91. In more detail, the substrate potential $V_{SSB2}$ is determined shallower (closer to the ground potential) than the substrate potential $V_{SSB1}$, and the control circuit 19 is so constructed as to output the substrate potential $V_{SSB2}$ when the external supply voltage Vcc is low.

In the case of the ninth embodiment shown in FIG. 16, either one of the substrate potentials $V_{SSB1}$ and $V_{SSB2}$ generated by two substrate potential generating circuits 94 and 95, respectively is selected by a switching circuit 96 on the basis of a control signal applied by a control circuit 93, and then outputted to the outside.

In the case of the tenth embodiment shown in FIG. 17, either one of the substrate potential generating circuits 98 and 99 is activated under control of a control circuit 97 to generate the substrate potential $V_{SSB1}$ or $V_{SSB2}$. The generated substrate potential is outputted by a switching circuit 100.

As described above, the substrate potential can be changed according to the supply voltage. For instance, when the external supply voltage Vcc is low, the substrate potential is determined to be shallower (closer to the ground potential). Therefore, the back gate bias effect of MOS transistors can be suppressed and thereby it is possible to lower the threshold value, with the result that the MOS transistors can be used at an appropriate low threshold value when the external supply voltage Vcc is low, to eliminate erroneous operation.

Figure 18:
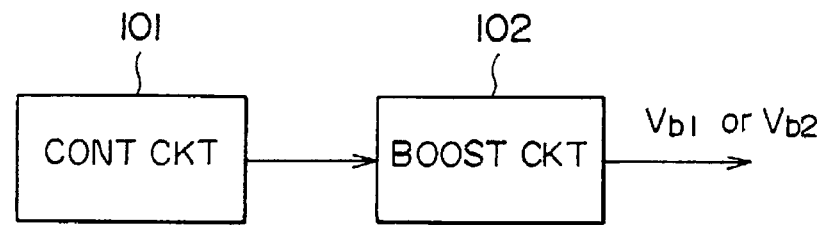
FIG. 18 is a circuit diagram showing an eleventh embodiment of the semiconductor device according to the present invention.
Figure 19:
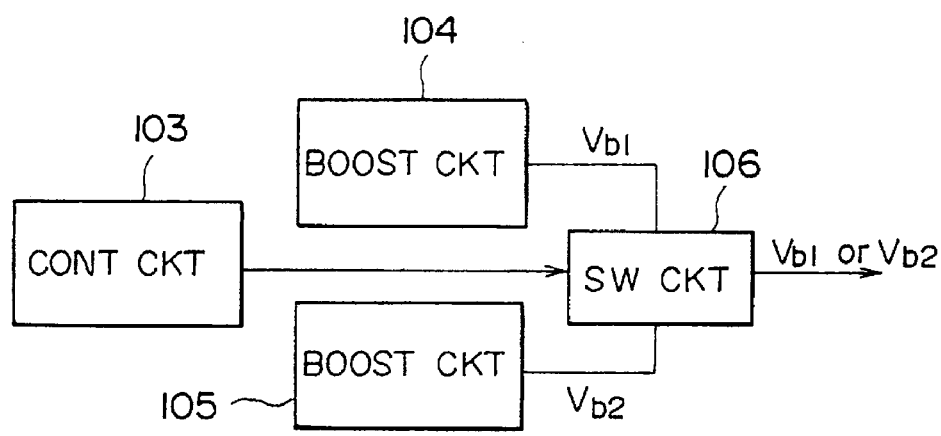
FIG. 19 is a circuit diagram showing a twelfth embodiment of the semiconductor device according to the present invention.
Figure 20:
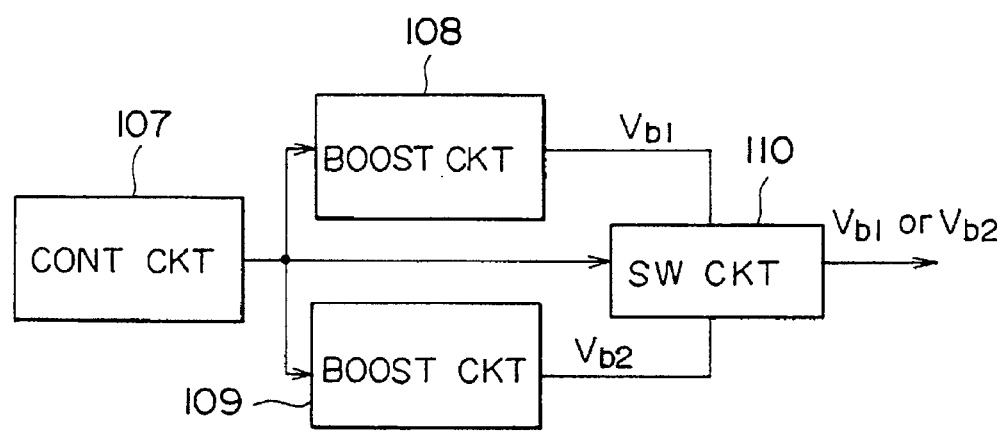
FIG. 20 is a circuit diagram showing a thirteenth embodiment of the semiconductor device according to the present invention.

FIGS. 18 to 20 show an eleventh to thirteenth embodiments of the present invention. In these embodiments, a boosted voltage is outputted by changing the boost ratio according to the magnitude of the external supply voltage Vcc. The circuit configurations of these embodiments are basically the same as with the cases of the fifth to seventh embodiments shown in FIGS. 12 to 14 or the eighth to tenth embodiments shown in FIGS. 15 to 17, respectively. The boosted voltage is used as a boosted supply voltage for a word line boosting circuit of a DRAM, for instance.

In the case of the eleventh embodiment shown in FIG. 18, either one of the boosted voltages $V_{b1}$ and $V_{b2}$ is generated by a booster circuit 102 on the basis of a control signal applied by a control circuit 101.

In the case of the twelfth embodiment shown in FIG. 19, boosted voltages $V_{b1}$ and $V_{b2}$ are generated by two booster circuits 104 and 105, respectively, and either one of them is outputted by a switching circuit 106 under control of a control circuit 103.

In the case of the thirteenth embodiment shown in FIG. 20, any one of two booster circuits 108 and 109 is activated under control of a control circuit 107, and either one of the boosted voltages $V_{b1}$ and $V_{b2}$ generated by the booster circuits 108 and 109 is outputted by a switching circuit 110.

As described above, the boosted voltage can be controlled according to the magnitude of the external supply voltage Vcc. When the external supply voltage Vcc is low, the boost voltage ratio is increased, so that the voltage applied to the word lines of a DRAM, for instance can be increased to securely turn on the selected cell transistors. Therefore, it is possible to prevent the erroneous operation and further to shorten the access time.

Here, in the control circuits of the fifth to thirteenth embodiments, the control signal can be generated according to the magnitude of the external supply voltage Vcc. That is, in the case where a fuse is provided for the control circuit, two control signals can be generated when the fuse is melted off and when not melted off, according to the level of the external supply voltage Vcc. These practical circuits are basically the same as those shown in FIGS. 2 and 3. Alternatively, it is also possible to adopt bonding pads. In this case, the control signals can be generated when the bonding pads are shorted by bonding wire and when not shorted, according to the level of the external supply voltage Vcc. These practical circuits are basically the same as those shown in FIGS. 4 and 5. Or else, it is also possible to use a non-volatile cell memory device of MOS transistors each having a floating gate. In this case, the level information of the external supply voltage Vcc is previously written in the cell memory device. Further, it is also possible to provide a circuit for detecting the level of the external supply voltage Vcc and for generating control signals automatically according to the levels of the detected external supply voltage Vcc. Further, it is also possible to apply the control circuits 12 shown in FIG. 1 as an example of the first embodiment and other circuits as shown in FIGS. 2, 4 and 5, to the control circuits of the fifth to thirteenth embodiments, as already described. Or, the circuits similar to those shown in FIGS. 7 to 9 as the examples of the second embodiment can be also adopted.

In each of the first to third embodiments, the single semiconductor device can be used for the different external supply voltages Vcc. Therefore, it is unnecessary to manufacture the device for a high external supply voltage and the device for a low external supply voltage, separately, thus not only reducing the manufacturing cost but also enabling the devices to be supplied according to the users' necessity after the devices have been manufactured.

Further, in general when the device is used at a low voltage, the operation margin is reduced and therefore the device tends to be defective as compared with when used at a high voltage. However, there exists many cases where the devices determined to be defective at a low voltage can be used at a high voltage. Therefore, it is possible to improve the production yield of the devices as compared with the case where the devices are manufactured for only high voltage or low voltage, separately.

The above-mentioned embodiments have been described by way of example, and therefore these embodiments do not limit the scope of the present invention. For instance, as an example of the semiconductor device of the present invention, without being limited only to the circuit configurations of the first embodiment as shown in FIGS. 1 to 5, it is possible to adopt the circuit such that when the external supply voltage is lower than a predetermined value, the internal supply voltage deboosting circuit can be deactivated and further the external supply voltage can be outputted as the internal supply voltage.

Further, in the above-mentioned embodiments, although two high and low external supply voltages of 5 V and 3.3 V have been explained by way of example, the device of the present invention can be applied to the case where the device is operated on the basis of three or more voltages. In this case, the dimensions of the internal supply voltage driving transistor or the output transistors are determined to be maximum when the level of the external supply voltage is the minimum, for instance.

As described above, in the semiconductor device according to the present invention, when the external supply voltage is low, since the internal supply voltage deboosting circuit is deactivated and the external supply voltage is outputted as the internal supply voltage, it is possible to reduce the current consumption and further to secure the operation margin.

Further, when the external supply voltage is low, the conductance of the internal supply voltage driving transistors is determined to be large for prevention of voltage drop; and when the external supply voltage is high, the conductance thereof is determined to be small for elimination of noise generated during the switching operation and further for securing the operation margin.

In the case of the semiconductor device provided with an output buffer, when the external supply voltage is low, the conductance of the output transistors is determined to be large for prevention of voltage drop; and when the external supply voltage is high, the conductance thereof is determined to be large for elimination of switching noise and further for prevention of the erroneous operation.

Further, in the case where the operation of the circuit for activating the sense amplifier circuit is controlled by the reference potential, when the external supply voltage is low, the reference potential is determined to be high for reduction of time required to activate the circuit; and when the external supply voltage is high, the reference potential is determined to be low for elimination of switching noise.

Further, in the semiconductor device according to the present invention, the device can cope with different external supply voltages, and further can be used according to the users' necessity after the device has been manufactured. Further, even if the manufactured device is defective at a low supply voltage, since the same device can be used at a high supply voltage, it is possible to improve the production yield as compared with the case where the devices for only a low external supply voltage are manufactured.

What is claimed is:

1. A semiconductor device, comprising:

a reference potential generating circuit for receiving a power supply voltage and for outputting a reference potential;

a differential amplifier connected to the reference potential generating circuit, said differential amplifier receiving the reference potential and a first signal, said differential amplifier comparing the first signal with the reference potential, and outputting a second signal based on a result of the comparison;

an output circuit connected to the differential amplifier and having an internal power supply voltage terminal connected to a first bonding pad, said output circuit receiving the second signal and the power supply voltage, said output circuit generating and outputting an internal power supply voltage based on the second signal from the internal power supply voltage terminal, and outputting the first signal based on the internal power supply voltage to the differential amplifier; and a control circuit having an input terminal connected to a second bonding pad, said control circuit outputting a control signal to control operations of the reference potential generating circuit, the differential amplifier, and the output circuit, wherein, in a case when the first and second bonding pads are connected to a power supply voltage terminal, the reference potential generating circuit, the differential amplifier, and the output circuit do not operate as controlled by the control signal, and the power supply voltage is output as the internal power supply voltage from the internal power supply voltage terminal.

2. The semiconductor device of claim 1, wherein the reference potential generating circuit is connected to the power supply voltage terminal and to an output terminal of the control circuit, the differential amplifier is connected to the internal power supply voltage terminal and to the output terminal of the control circuit, the output circuit has an output transistor connected between the power supply voltage terminal and the internal power supply voltage terminal, said output transistor being controlled by the second signal, said output circuit having two resistive elements connected in series between the internal power supply voltage terminal and the output terminal of the control circuit, said output circuit outputting the first signal from a node connecting the two resistive elements, the control circuit has two inverters connected in series between the input terminal of the control circuit and the output terminal of the control circuit, and wherein, in a case when the first and second bonding pads are connected to the power supply voltage terminal, the control signal has a substantially same voltage level as the power supply voltage.

3. The semiconductor device of claim 1, wherein the control circuit has a fuse and a resistive element connected in series between the power supply voltage terminal and a ground terminal, and an inverter having an input terminal connected to a node connecting the fuse and the resistive element and an output terminal connected to the output terminal of the control circuit, and and wherein, in a case when the fuse is blown, the control signal has a substantially same voltage as the power supply voltage.

4. The semiconductor device of claim 1, wherein the reference potential generating circuit is connected to the internal power supply voltage terminal and to an output terminal of the control circuit, the differential amplifier is connected to the power supply voltage terminal and to the output terminal of the control circuit, the output circuit has an output transistor connected between the power supply voltage terminal and the internal power supply voltage terminal, said output transistor being controlled by the second signal, said output circuit having two resistive elements connected in series between the internal power supply voltage terminal and the output terminal of the control circuit, said output circuit outputting the first signal from a node connecting the resistive elements, the control circuit has an inverter having an input terminal connected to the second bonding pad and a transistor connected between the output terminal of the control circuit and the ground terminal, said transistor having a gate terminal connected to an output terminal of the inverter, and wherein, in a case when the first and second bonding pads are connected to the power supply voltage terminal, the transistor of the control circuit turns off so that the reference potential generating circuit, the differential amplifier, and the output circuit do not operate, and wherein the output circuit outputs the power supply voltage as the internal power supply voltage.

5. A semiconductor device, comprising:

a reference potential generating circuit for receiving a power supply voltage and for outputting a reference potential;

a differential amplifier for receiving the reference potential and a first signal, said differential amplifier comparing the first signal with the reference potential, and outputting a second signal based on a result of the comparison;

an output circuit for receiving the second signal, said output circuit generating and outputting an internal power supply voltage based on the second signal from an internal power supply voltage terminal disposed therein, and outputting the first signal derived from the internal power supply voltage to the differential amplifier;

a first control circuit having an input terminal connected to a bonding pad, said first control circuit outputting a control signal to control operations of the reference potential generating circuit, the differential amplifier, and the output circuit; and a second control circuit having a fuse and a resistive element connected in series between a power supply voltage terminal and a ground terminal, two inverters connected in series and having an input terminal connected to a node connecting the fuse and the resistive element, a transistor connected between the power supply voltage terminal and the internal power supply terminal of the output circuit, said transistor having a gate terminal that is connected to an output terminal of the inverters, wherein, in a case when the bonding pad is connected to the power supply voltage terminal and the fuse is blown, the reference potential generating circuit, the differential amplifier, and the output circuit do not operate as controlled by the control signal, and the transistor of the control circuit turns on so that the internal power supply voltage terminal is connected to the power supply voltage terminal such that the output circuit outputs the power supply voltage as the internal power supply voltage.

6. A semiconductor device, comprising:

a reference potential generating circuit for receiving a power supply voltage and for outputting a reference potential;

a differential amplifier connected to the reference potential generating circuit, said differential amplifier receiving the reference potential and a first signal, said differential amplifier comparing the first signal with the reference potential, and outputting a second signal based on a result of the comparison;

an output circuit having an internal power supply voltage terminal connected to a first bonding pad, said output circuit receiving the second signal, said output circuit outputting an internal power supply voltage from the internal power supply voltage terminal disposed therein, and outputting the first signal based on the internal power supply voltage to the differential amplifier; and a control circuit having an input terminal connected to a second bonding pad, said control circuit outputting a control signal to control operations of the reference potential generating circuit, the differential amplifier, and the output circuit, wherein, in a case when the first bonding pad is connected to a power supply voltage terminal and the second bonding pad is connected to a ground terminal, the reference potential generating circuit, the differential amplifier, and the output circuit do not operate as controlled by the control signal, and the power supply voltage is output as the internal power supply voltage from the internal power supply terminal.

7. A semiconductor device, comprising:

a detecting circuit for receiving a power supply voltage and for outputting a first detection signal when the power supply voltage is lower than a predetermined level, said detecting circuit outputting a second detection signal when the power supply voltage is greater than or equal to the predetermined level;

an output transistor connected between a power supply voltage terminal and an output terminal of the semiconductor device, said output transistor having a gate terminal that is connected to a control terminal of the semiconductor device;

a control circuit connected between an output terminal of the detecting circuit and the control terminal, said control circuit outputting an off signal to the control terminal to turn the output transistor off when the detecting circuit outputs the second detection signal;

a reference potential generating circuit connected to the control circuit, said reference potential generating circuit receiving the power supply voltage and outputting a reference potential signal;

a differential amplifier connected to the control circuit and the reference potential generating circuit, said differential amplifier comparing a first signal with the reference potential signal and outputting a second signal to the control terminal in order to control a conductive resistance of the output transistor when the detecting circuit outputs the first detection signal, wherein the differential amplifier does not operate when the detecting circuit outputs the second detection signal; and a resistive divider having a plurality of resistive elements connected in series between the output terminal of the semiconductor device and an output terminal of an inverter which has an input terminal connected to the output terminal of the detecting circuit, wherein a conjunction node of the resistive elements operates as an output terminal for outputting the first signal when the detecting circuit outputs the first detection signal.

8. The semiconductor device of claim 7, wherein the detecting circuit includes:

a resistive divider having a plurality of resistive elements connected between the power supply voltage terminal and the ground terminal, a conjunction node connecting the resistive elements of the detecting circuit operates as an output terminal for outputting a third signal based on the power supply voltage; and an inverter for receiving the third signal, for comparing the third signal with a predetermined level, and for outputting one of the first and second detection signal in accordance with the comparison result.

9. The semiconductor device of claim 7, wherein the detecting circuit includes:

a resistive divider having a plurality of resistive elements connected between the power supply voltage terminal and the ground terminal, a conjunction node connecting the resistive elements of the detecting circuit operates as an output terminal for outputting a third signal based on the power supply voltage;

a differential amplifier for receiving the third signal and the reference potential, for comparing the third signal with the reference potential, and for outputting a fourth signal; and an inverter for receiving the fourth signal, for comparing the fourth signal with a predetermined level, and for outputting one of the first and second detection signal in accordance with the comparison result.

10. A semiconductor device, comprising:

a detecting circuit for receiving a power supply voltage and for outputting a first detection signal when the power supply voltage is lower than a predetermined level, said detecting circuit outputting a second detection signal when the power supply voltage is greater than or equal to the predetermined level;

a sense circuit for receiving data transferred from a pair of bit lines, for sensing the data, and for outputting a first and a second signal as a result thereof;

a first inverter having a first P-channel transistor with a gate terminal which receives the first signal and a first N-channel transistor with a gate terminal which receives the second signal, wherein said first P-channel transistor and said first N-channel transistor are connected in series between a power supply voltage terminal and a ground terminal, and wherein a conjunction node of the first P-channel transistor and the second N-channel transistor is connected to an output terminal of the semiconductor device; and a second inverter connected to the detecting circuit, said second inverter having a second P-channel transistor with a gate terminal which receives the first signal, a second N-channel transistor with a gate terminal which receives one of the first detection signal and the second detection signal, a third N-channel transistor with a gate terminal which receives one of the first detection signal and the second detection signal, and a fourth N-channel transistor with a gate terminal which receives the second signal, wherein the first, second, third and fourth N-channel transistors are connected in series between the power supply voltage terminal and a ground terminal, and wherein a conjunction node of the second N-channel transistor and the third N-channel transistor is connected to the output terminal of the semiconductor device, wherein the first and second inverters output data in accordance with the first and second signals in a first case when the detecting circuit outputs the first detection signal, and the second inverter does not operate and the first inverter outputs data in accordance with the first and second signals in a second case when the detecting circuit outputs the second detection signal.

11. A semiconductor device, comprising:

a detecting circuit for receiving a power supply voltage and for outputting a first detection signal when the power supply voltage is lower than a first predetermined level, the detecting circuit outputting a second detection signal when the power supply voltage is greater than or equal to the first predetermined level;

a reference potential generating circuit for receiving the power supply voltage from the detecting circuit and for outputting a reference potential having a second predetermined level, an internal supply voltage deboosting circuit for receiving the power supply voltage from the detecting circuit, said internal supply voltage deboosting circuit deboosting the power supply voltage to a third predetermined level and outputting the deboosted power supply voltage as an internal supply voltage;

a first control circuit having a transistor being controlled by one of the first detection signal and the second detection signal, the first control circuit being connected between an output terminal of the internal supply voltage deboosting circuit and an output terminal of the reference potential generating circuit, wherein, when the detecting circuit outputs the first detection signal, the transistor turns on and outputs the internal supply voltage outputted from the internal supply voltage deboosting circuit, and when the detecting circuit outputs the second detection signal, the transistor turns off and the reference potential is outputted;

a second control circuit for receiving an externally supplied enable signal and for outputting a first signal as a result thereof; and a third control circuit having a first P-channel transistor being controlled by the first signal and a second P-channel transistor with a gate terminal connected to a first node connected in parallel between the power supply voltage terminal and the first node, a first N-channel transistor connected between the first node and a ground terminal and being controlled by one of the internal supply voltage and the reference potential, and a third P-channel transistor with a gate terminal connected to the first node connected between the power supply voltage terminal and a second node for enabling a sense amplifier, wherein when the first control circuit outputs the terminal power supply voltage and the second control circuit outputs the first signal, the first P-channel transistor turns on, a conductive resistance of the first N-channel transistor becomes a first value, and the third P-channel transistor outputs a first enable signal to the sense amplifier via the second node, and wherein when the first control circuit outputs the reference potential and the second control circuit outputs the first signal, the first P-channel transistor turns on, a conductive resistance of the first N-channel transistor becomes a second value being greater than the first value, and the third P-channel transistor outputs a second enable signal having a voltage being lower than that of the first enable signal to the sense amplifier via the second node.

12. A semiconductor device, comprising:

a control circuit having a control input terminal connected to a bonding pad, a discharge means for discharging the control input terminal, two inverters connected in series between the control input terminal and a control output terminal, wherein in a case when the bonding pad is connected to a power supply voltage terminal, a first control signal is output from the control output terminal, and in the case that the bonding pad is not connected to the power supply voltage terminal and the control terminal is not supplied with the power supply voltage and is discharged by the discharging means, a second control signal is output from the control output terminal;

a first reference potential generating circuit for outputting a first reference potential when the control circuit outputs the first control signal;

a second reference potential generating circuit for outputting a second reference potential when the control circuit outputs the second control signal; and a switching circuit connected to the first and second reference potential generating circuits, the switching circuit being controlled by one of the first and second control signal, the switching circuit receiving and outputting the first reference potential when the control circuit outputs the first control signal, and the switching circuit receiving and outputting the second reference potential when the control circuit outputs the second control signal.

13. A semiconductor device, comprising:

a control circuit having a fuse connected to a power supply voltage terminal and a node, a discharge means for discharging the node, an inverter connected between the node and a control output terminal, wherein in a first case when the fuse is not blown, a first control signal is output from the control output terminal, and in a second case when the fuse is blown and the node is discharged by the discharge means, a second control signal is output from the control output terminal;

a first reference potential generating circuit for outputting a first reference potential when the control circuit outputs the first control signal;

a second reference potential generating circuit for outputting a second reference potential when the control circuit outputs the second control signal; and a switching circuit connected to the first and second reference potential generating circuits, the switching circuit being controlled by one of the first and second control signal, the switching circuit receiving and outputting the first reference potential when the control circuit outputs the first control signal, and the switching circuit receiving and outputting the second reference potential when the control circuit outputs the second control signal.

14. A semiconductor device, comprising:

a control circuit having a control input terminal connected to a bonding pad, a charge means for charging the control input terminal, an inverter connected between the control input terminal and a control output terminal, wherein in a first case when the bonding pad is not connected to a ground terminal and the control input terminal is charged by the charge means, a first control signal is output from the control output terminal, and in a second case when the bonding pad is connected to the ground terminal, a second control signal is output from the control output terminal;

a first reference potential generating circuit for outputting a first reference potential when the control circuit outputs the first control signal;

a second reference potential generating circuit for outputting a second reference potential when the control circuit outputs the second control signal; and a switching circuit connected to the first and second reference potential generating circuits, the switching circuit being controlled by one of the first and second control signal, the switching circuit receiving and outputting the first reference potential when the control circuit outputs the first control signal, and the switching circuit receiving and outputting the second reference potential when the control circuit outputs the second control signal.

15. A semiconductor device, comprising:

a control circuit having a control input terminal connected to a bonding pad, a discharge means for discharging the control input terminal, two inverters connected in series between the control input terminal and a control output terminal, wherein in a first case when the bonding pad is connected to the power supply voltage terminal, a first control signal is output from the control output terminal, and in a second case when the bonding pad is not connected to the power supply voltage terminal and the control terminal is not supplied with the power supply voltage and is discharged by the discharge means, a second control signal is output from the control output terminal;

a first substrate potential generating circuit for outputting a first substrate potential when the control circuit outputs the first control signal;

a second substrate potential generating circuit for outputting a second substrate potential when the control circuit outputs the second control signal; and a switching circuit connected to the first and second substrate potential generating circuits, the switching circuit being controlled by one of the first and second control signal, the switching circuit receiving and outputting the first substrate potential when the control circuit outputs the first control signal, and the switching circuit receiving and outputting the second substrate potential when the control circuit outputs the second control signal.

16. A semiconductor device, comprising:

a control circuit having a fuse connected to a power supply voltage terminal and a node, a discharge means for discharging the node, an inverter connected between the node and a control output terminal, wherein in a first case when the fuse is not blown, a first control signal is output from the control output terminal, and in a second case when the fuse is blown and the node is discharged by the discharge means, a second control signal is output from the control output terminal;

a first substrate potential generating circuit for outputting a first substrate potential when the control circuit outputs the first control signal;

a second substrate potential generating circuit for outputting a second substrate potential when the control circuit outputs the second control signal; and a switching circuit connected to the first and second substrate potential generating circuits, the switching circuit being controlled by one of the first and second control signal, the switching circuit receiving and outputting the first substrate potential when the control circuit outputs the first control signal, and the switching circuit receiving and outputting the second substrate potential when the control circuit outputs the second control signal.

17. A semiconductor device, comprising:

a control circuit having a control input terminal connected to a bonding pad, a charge means for charging the control input terminal, an inverter connected between the control input terminal, an inverter connected between the control output terminal and a output terminal, wherein in a first case when the bonding pad is not connected to a ground terminal and the control input terminal is charged by the charge means, a first control signal is output from the control output terminal, and in a second case when the bonding pad is connected to the ground terminal, a second control signal is output from the control output terminal;

a first substrate potential generating circuit for outputting a first substrate potential when the control circuit outputs the first control signal;

a second substrate potential generating circuit for outputting a second substrate potential when the control circuit outputs the second control signal; and a switching circuit connected to the first and second substrate potential generating circuits, the switching circuit being controlled by one of the first and second control signal, the switching circuit receiving and outputting the first substrate potential when the control circuit outputs the first control signal, and switching circuit receiving and outputting the second substrate potential when the control circuit outputs the second control signal.

18. A semiconductor device, comprising:

a control circuit having a control input terminal connected to a bonding pad, a discharge means for discharging the control input terminal, two inverters connected in series between the control input terminal and a control output terminal, wherein in a first case when the bonding pad is connected to the power supply voltage terminal, a first control signal is output from the control output terminal, and in a second case when the bonding pad is not connected to the power supply voltage terminal and the control terminal is not supplied with the power supply voltage and is discharged by the discharge means, a second control signal is output from the control output terminal;

a first booster circuit for outputting a first boosted potential when the control circuit outputs a first control signal;

a second booster circuit for outputting a second boosted potential when the control circuit outputs the second control signal; and a switching circuit connected to the first and second booster circuits, the switching circuit being controlled by one of the first and second control signal, the switching circuit receiving and outputting the first boosted potential when the control circuit outputs the first control signal, and the switching circuit receiving and outputting the second boosted potential when the control circuit outputs the second control signal.

19. A semiconductor device, comprising:

a control circuit having a fuse connected to a power supply voltage terminal and a node, a discharge means for discharging the node, an inverter connected between the node and a control output terminal, wherein in a first case when the fuse is not blown, a first control signal is output from the control output terminal, and in a second case when the fuse is blown and the node is discharged by the discharge means, a second control signal is output from the control output terminal;

a first booster circuit for outputting a first boosted potential when the control circuit outputs a first control signal;

a second booster circuit for outputting a second boosted potential when the control circuit outputs the second control signal; and a switching circuit connected to the first and second booster circuits, the switching circuit being controlled by one of the first and second control signal, the switching circuit receiving and outputting the first boosted potential when the control circuit outputs the first control signal, and the switching circuit receiving and outputting the second boosted potential when the control circuit outputs the second control signal.

20. A semiconductor device, comprising:

a control circuit having a control input terminal connected to a bonding pad, a charge means for charging the control input terminal, an inverter connected between the control input terminal and a control input terminal, wherein in a first case when the bonding pad is not connected to a ground terminal and the control input terminal is charged by the charge means, a first control signal is output from the control output terminal, and in a second case when the bonding pad is connected to the ground terminal, a second control signal is output from the control output terminal;

a first boosted potential generating circuit for outputting a first boosted potential when the control circuit outputs the first control signal;

a second boosted potential generating circuit for outputting a second boosted potential when the control circuit outputs the second control signal; and a switching circuit connected to the first and second boosted potential generating circuits, the switching circuit being controlled by one of the first and second control signal, the switching circuit receiving and outputting the first boosted potential when the control circuit outputs the first control signal, and the switching circuit receiving and outputting the second boosted potential when the control circuit outputs the second control signal.

21. A semiconductor device, comprising:

a first detecting circuit for receiving a power supply voltage and for outputting a first detection signal when the power supply voltage is lower than a predetermined level, said first detecting circuit outputting a second detection signal when the power supply voltage is greater than or equal to the predetermined level;

a second detecting circuit for receiving a power supply voltage and for outputting a third detection signal irrespective of a level of the power supply voltage;

a first output transistor connected between a power supply voltage terminal and an output terminal of the semiconductor device, said first output transistor having a gate terminal that is connected to a first control terminal of the semiconductor device;

a second output transistor connected between a power supply voltage terminal and an output terminal of the semiconductor device, said second output transistor having a gate terminal that is connected to a second control terminal of the semiconductor device;

a first control circuit connected between an output terminal of the first detecting circuit and the first control terminal, said first control circuit outputting an on signal to the first control terminal to turn the first output transistor on when the first detecting circuit outputs the first detection signal, said first control circuit outputting an off signal to the first control terminal to turn the first output transistor off when the first detecting circuit outputs the second detection signal;

a second control circuit connected between an output terminal of the second detecting circuit and the second control terminal, said second control circuit outputting an on signal to the second control terminal to turn the second output transistor on when the second detecting circuit outputs the third detection signal;

a reference potential generating circuit for receiving the power supply voltage and for outputting a reference potential;

a first differential amplifier for comparing a first signal with the reference potential output from the reference potential generating circuit and for outputting a second signal to the first control terminal in order to control a conductive resistance of the first output transistor when the first detecting circuit outputs the first detection signal, wherein the differential amplifier does not operate when the first detecting circuit outputs the second detection signal;

a second differential amplifier for comparing a third signal with the reference potential output from the reference potential generating circuit and for outputting a fourth signal to the second control terminal in order to control a conductive resistance of the second output transistor when the second detecting circuit outputs the third detection signal;

a first resistive divider having a plurality of first resistive elements connected in series between the output terminal of the semiconductor device and an output terminal of a first inverter which has an input terminal connected to the output terminal of the first detecting circuit, wherein a conjunction node of the first resistive elements operates as an output terminal for outputting the first signal when the first detecting circuit outputs the first detection signal; and a second resistive divider having a plurality of second resistive elements connected in series between the output terminal of the semiconductor device and an output terminal of a second inverter which has an input terminal connected to the output terminal of the second detecting circuit, wherein a conjunction node of the second resistive elements operates as an output terminal for outputting the third signal when the second detecting circuit outputs the third detection signal.

22. The semiconductor device of claim 21, wherein the first detecting circuit includes:

a third resistive divider having a plurality of resistive elements connected between the power supply voltage terminal and the ground terminal, a conjunction node connecting the resistive elements of the first detecting circuit operating as an output terminal for outputting a fifth signal based on the power supply voltage; and a first inverter for receiving the fifth signal, for comparing the fifth signal with a first predetermined level, and for outputting one of the first and second detection signal in accordance with the comparison results; and wherein the second detecting circuit includes:

a fourth resistive divider having a plurality of resistive elements connected between the power supply voltage terminal and the ground terminal, a conjunction node connecting the resistive elements of the second detecting circuit operating as an output terminal for outputting a sixth signal based on the power supply voltage; and a second inverter for receiving the sixth signal, for comparing the sixth signal with a second predetermined level, and for outputting the third detection signal in accordance with the comparison result.

23. The semiconductor of claim 21, wherein the first detecting circuit includes:

a third resistive divider having a plurality of resistive elements connected between the power supply voltage terminal and the ground terminal, a conjunction node connecting the resistive elements of the first detecting circuit operating as an output terminal for outputting a fifth signal based on the power supply voltage;

a third differential amplifier for receiving the fifth signal and the reference potential, for comparing the fifth signal with the reference potential, and for outputting a sixth signal; and a first inverter for receiving the sixth signal, for comparing the sixth signal with a first predetermined level, and for outputting one of the first and second detection signal in accordance with the comparison result; and wherein the second detecting circuit includes:

a fourth resistive divider having a plurality of resistive elements connected between the power supply voltage terminal and the ground terminal, a conjunction node connecting the resistive elements of the second detecting circuit operates as an output terminal for outputting a seventh signal based on the power supply voltage;

a second differential amplifier for receiving the seventh signal and the reference potential, for comparing the seventh signal with the reference potential, and for outputting an eighth signal; and a second inverter for receiving the eighth signal, for comparing the eighth signal with a second predetermined level, and for outputting the third detection signal in accordance with the comparison result.

\* \* \* \* \*